United States Patent [19]

Shapiro et al.

[11] 4,097,793

[45] Jun. 27, 1978

[54] X-RAY TESTING SYSTEM

[75] Inventors: Jonathan S. Shapiro, Greenwich; Vincent Berluti, Jr., West Haven, both of Conn.; Anthony Pellegrino, Brewster, N.Y.; Howard G. Wagner, Stamford, Conn.

[73] Assignee: The Machlett Laboratories, Inc., Stamford, Conn.

[21] Appl. No.: 734,948

[22] Filed: Oct. 22, 1976

[51] Int. Cl.² ............................................ G01R 31/024

[52] U.S. Cl. ............................... 324/20 R; 250/416 R

[58] Field of Search .................... 324/20 R, 22, 23, 24, 324/25, 103 R, 120, 142; 250/401, 416

[56] References Cited

U.S. PATENT DOCUMENTS

| | | | |
|---|---|---|---|
| 3,718,860 | 2/1973 | Kwast | 324/142 |
| 3,818,340 | 6/1974 | Yamaguchi | 324/142 |
| 3,878,455 | 4/1975 | Ochmann | 324/20 CR |
| 3,963,931 | 6/1976 | Shapiro | 250/416 R |

*Primary Examiner*—Rudolph V. Rolinec
*Assistant Examiner*—Michael J. Tokar
*Attorney, Agent, or Firm*—John T. Meaney; Joseph D. Pannone; Harold A. Murphy

[57] ABSTRACT

An X-ray tube test system comprising signal processing circuitry including means for converting an analog signal representative of anode current into a train of pulses having an instantaneous frequency proportional to corresponding instantaneous amplitude values of the analog signal, means for counting the pulses in the train during an exposure time interval to obtain an integrated milliampere-second (MAS) value, means for summing a train of pulses having a uniform frequency during an interval of time equivalent to the exposure time interval to obtain an integral value for the exposure time, means for optionally dividing the MAS value by the exposure time value to obtain an average anode current (MA) value during the exposure time interval, and means for displaying numerical equivalents of the values thus obtained.

13 Claims, 10 Drawing Figures

X-RAY TESTING SYSTEM

BACKGROUND OF THE INVENTION

1. Field of the Invention

This invention relates generally to X-ray tube test systems and is concerned more particularly with a system for measuring X-ray exposure (MAS) directly from the operation of an X-ray tube, and for converting the MAS value into anode current (MA) when desired.

2. Discussion of the Prior Art

It is well known that an X-ray beam emanating from an X-ray tube may be passed through a selected portion of a patient to produce a shadow image of the internal structure on an aligned X-ray film. However, the quality of the X-ray image is dependent on the intensity of the X-ray flux, which is proportional to X-ray tube anode current (MA), and on the duration of the X-ray exposure interval (in seconds). Consequently, the product of the anode current and the X-ray exposure interval yields an exposure quantity (MAS) which may be adjusted to provide the desired X-ray image on the film while protecting the patient from excessive exposure to X-radiation and protecting the X-ray target from damage due to excessive heat.

As a result, various means have been developed in the prior art for measuring the anode current directly during operation of the X-ray tube, and for measuring time during the X-ray exposure interval. However, these prior art means generally require an additional operation to obtain the X-ray exposure quantity MAS. Also, these prior art measuring systems generally employ meters or oscilloscopes which do not provide a sufficiently accurate measurement for calibrating the X-ray tube in accordance with public health laws.

Therefore, it is advantageous and desirable to provide an X-ray tube test system with means for accurately measuring the exposure quantity MAS directly from the operation of the tube and for converting it into anode current (MA) when desired.

SUMMARY OF THE INVENTION

Accordingly, this invention provides an X-ray system including means for digitizing and summing an anode current signal during an X-ray exposure interval to obtain an integrated milliamperes-seconds (MAS) quantity which is stored, means for digitizing and summing the exposure interval to obtain an integrated exposure time quantity which is stored, means for dividing the stored MAS quantity by the stored time quantity when the exposure interval is completed to obtain an average anode current (MA) quantity over the exposure interval, and means for displaying numerical values of the MAS quantity or the MA quantity when desired.

The system may include a current sensing means disposed for connection into the anode circuit of an X-ray tube to produce an analog voltage signal representative of anode current during an exposure interval and apply it to the input of a voltage digitizing means. The voltage digitizing means may comprise a voltage-to-frequency converter means for producing a train of pulses having an instantaneous frequency proportional to the instantaneous amplitude of the input analog signal and applying the pulses through an exposure gate means during the exposure interval to an MAS pulse summing means. The system includes a time digitizing means comprising an oscillator means for producing a train of pulses having a uniform frequency proportional to equal increments of time and applying the pulses through a time gate means to a time summing means for a time interval equivalent to the exposure interval.

The MAS summing means may comprise an MAS counter means for counting the pulses allowed through the exposure gate means to store the resulting MAS quantity and apply it, when desired, to a programmer means. The time summing means may comprise a time counter means for counting the pulses allowed through the time gate means to store the resulting time quantity and apply it, when desired, to the programmer means. Both the MAS counter means and the time counter means may be provided with respective autoranging means for locating decimal points in the associated stored quantities, and applying corresponding data coded information to the programmer means.

The system also includes trigger signal processing means including trigger circuit means having automatic gain limiting means and threshold voltage select means for producing a suitable trigger signal during the exposure interval. The trigger signal processing means also includes exposure gate signal generating means connected to the output of the trigger circuit means for producing an exposure gate signal and applying it to an input terminal of the exposure gate means thereby permitting pulses from the voltage digitizing means to pass through the gate means during an exposure interval. The trigger signal processing means also includes time gate signal generating means connected to the respective outputs of the trigger circuit means and the exposure gate means for producing a time gate signal and applying it to an input terminal of the time gate means, thereby permitting pulses from the time digitizing means through the gate means for an interval of time equivalent to the exposure interval. The trigger signal processing means also includes reset signal generating means connected to the output of the exposure gate means for producing a reset pulse signal during an initial portion of the exposure gate signal to remove gain limiting bias in the trigger circuit means and to zero all counters in the MAS counter means, the time counter means, and the programmer means.

The trigger signal processing means includes a timing control means connected to the output of the exposure gate means for deactivating the programmer means during the exposure interval and re-activating it at the completion of the exposure interval. The trigger signal processing means also includes an MAS/MA select means connected to the timing control means for generating therein signals determinative of the operating mode of the programming means. The timing control means also receives from the programmer means a decimal point signal for deactivating the programmer means momentarily while a decimal point signal is being routed to a calculating signal means connected to the programmer means. The timing control means also is connected to the calculating signal means for applying thereto a key switch simulating signal.

The programmer means includes counter means connected to multiplexer means for routing signals from the MAS counter means and the time counter means to the calculating signal processing means in a predetermined sequence. The calculating means includes means for processing input MAS counter and time counter signals in accordance with instructions received from the programmer means. The calculating signal means also includes code converter means comprising a custom programmed read-only memory module connected to the output of the calculator means for transforming signals received therefrom into suitable form for a connected display means. The display means includes logic means and light emitting diode means for displaying the most significant digits produced by the calculator means.

BRIEF DESCRIPTION OF THE DRAWINGS

For a better understanding of this invention, reference is made in the following detailed description to the accompanying drawings wherein.

DESCRIPTION OF THE PREFERRED EMBODIMENT

Figure 1:
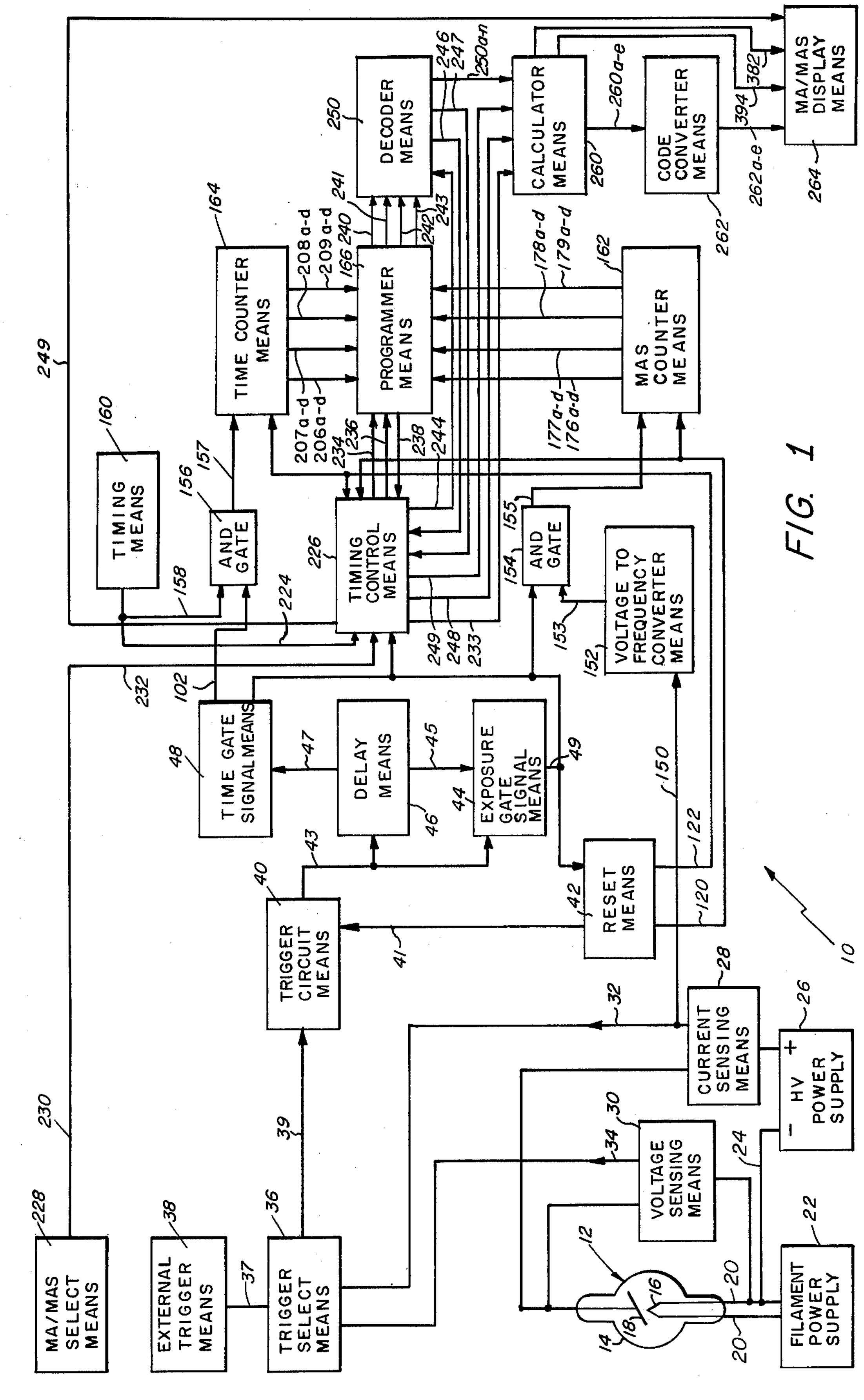
FIG. 1 is a block diagramm view of an X-ray test system embodying the invention.

Referring to the drawing wherein like characters of reference designate like parts, there is shown in FIG. 1 an X-ray test system 10 which may include an X-ray tube 12 of the conventional type. X-ray tube 12 comprises an evacuated envelope 14 wherein an electron emitting cathode 16 is disposed for electrostatically beaming electrons onto a spaced anode target 18 to generate an X-ray beam (not shown) which emerges from tube 12. The cathode 16 may be of the filamentary type having a pair of terminal conductors 20 electrically connected to a filament power supply 22, which provides the necessary current for heating the cathode to electron emitting temperatures.

One of the cathode conductors 20 is connected through a conductor 24 to a negative terminal of a high voltage power supply 26 which has a positive terminal connected through a suitable current sensing means 28 to the anode of X-ray tube 12. The power supply 26 may include a full wave rectifier, such as a diode bridge, for example, connected across the secondary of a transformer which may be energized by a single phase or a three phase generator. The current sensing means 28 may be of the type disclosed in U.S. Pat. No. 3,363,931 granted to Jonathan S. Shapiro and assigned to the assignee of this invention, for example, whereby a low voltage output signal corresponding to the analog waveform of the electron current passing through X-ray tube 12 is produced. Also, externally of X-ray tube 12, there may be connected electrically across the cathode 16 and the anode target 18 a voltage sensing means 30. A suitable voltage sensing means 30 may be of the type described in U.S. Pat. No. 4,034,283 granted to Anthony Pellegrino and assigned to the assignee of this invention, for example, whereby a low voltage output signal corresponding to the analog waveform of the anode-to-cathode voltage during an X-ray exposure is produced. Thus, the output signals produced by the current sensing means 28 and the voltage sensing means 30 will exhibit rectified single phase or three phase characteristics of the high voltage power supply 26.

The analog voltage signal proportional to X-ray tube current, such as one millivolt per milliampere (MA) of tube current, for example, is applied to a current sensing means output conductor 32, which is connected to a trigger select means 36. Similarly, the analog signal proportional to the X-ray tube voltage, such as one volt per ten kilovolts (KV), for example, is applied to a voltage sensing means output conductor 34, which is connected to the trigger select means 36. An external trigger means 38, such as an actuator switch for momentarily connecting a positive voltage source resistively to an electrical ground, for example, also may be connected to the trigger select means 36 through a conductor 37. The output of trigger select means 36 is connected through a conductor 39 to the input of a trigger circuit means 40, which also has an input terminal connected through a conductor 41 to a reset means 42. The trigger circuit means produces an output signal which is applied through a conductor 43 to an exposure gate means 44 and a delay means 46. The delay means 46 is connected through output conductors 45 and 47 to the exposure gate means 44 and to a time gate means 48, respectively. The resulting signal produced by exposure gate means 44 is applied to an output conductor 49, which is connected to the time gate means 48 and to the reset means 42.

Figure 2:
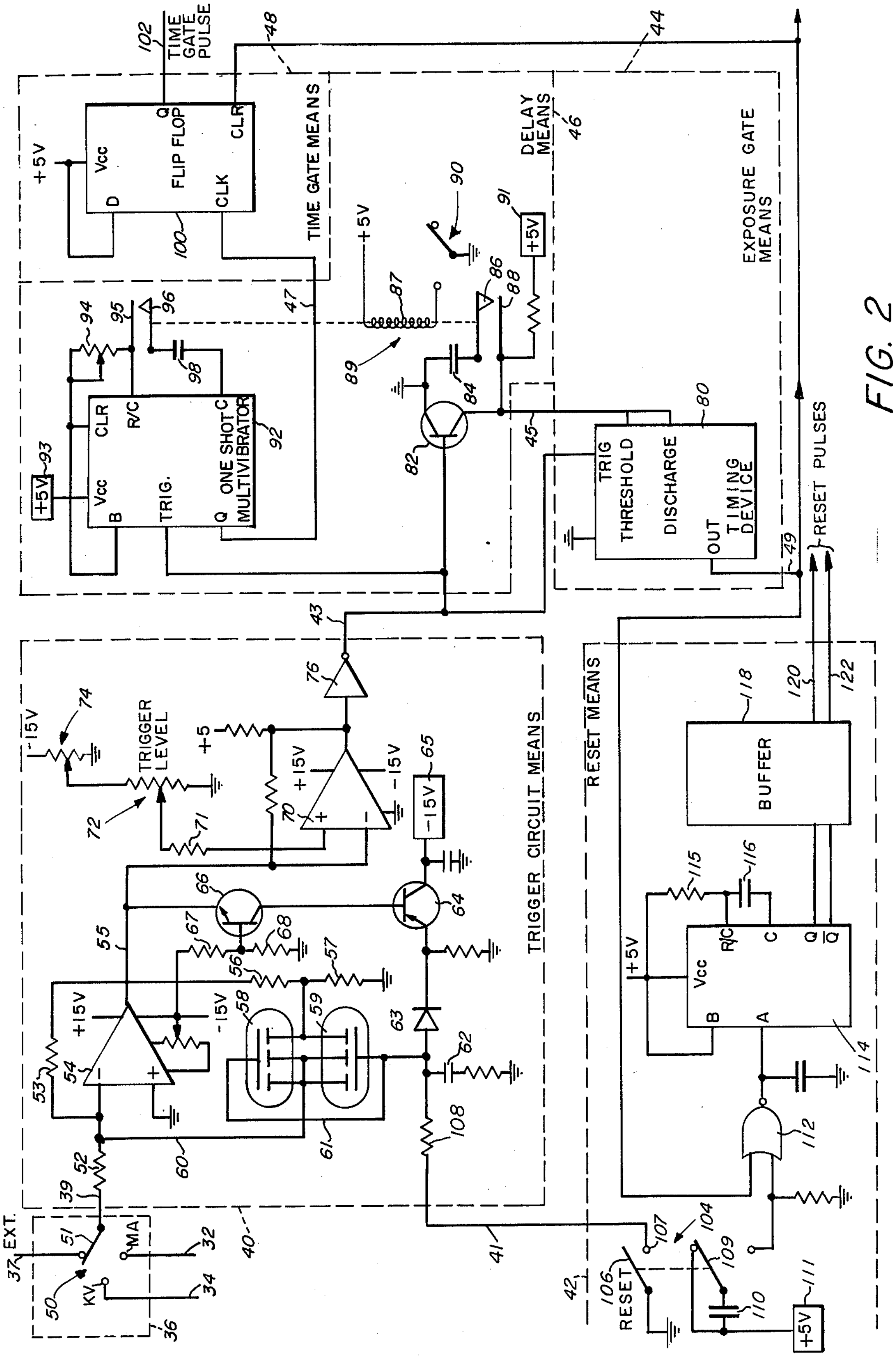
FIG. 2 is a schematic view of the trigger select means, the trigger circuit means, the exposure gate means, the time gate means, and the reset means shown in FIG. 1.

As shown in FIG. 2, the trigger select means 36 may comprise a switch 50 having the input conductors 32, 34, and 37 connected to respective spaced contacts thereof, and including a conductive arm 51 which is movable into electrical engagement with any one of the spaced contacts. The arm 51 is connected to the output conductor 39 and applies thereto a positive going signal selected from one of the contacts of switch 50. The trigger circuit means 40 may include gain controlled amplifier means comprising an operational amplifier 54 having a negative input terminal connect through an input resistor 52 to the conductor 39. The amplifier 54 has a positive input terminal connected to electrical ground, and an output conductor 55 connected through a feedback resistor 53 to the negative input terminal of the amplifier. Accordingly, the amplifier 54 inverts and amplifies the positive going signal received from conductor 39 to apply a corresponding negative going output signal to the conductor 55. Output conductor 55 is connected through a voltage divider network comprising series connected resistors 56 and 57, respectively, to electrical ground. Connected to the junction of resistors 56 and 57 are respective source electrodes of field-effect transistors 58 and 59, respectively, which have respective drain electrodes connected through a conductor 60 to the input terminal of amplifier 54. Thus, the field-effect transistors 58 and 59 provide negative feedback voltage means for controlling the gain of amplifier 54.

The gate electrodes of field-effect transistors 58 and 59 are connected through a conductor 61 to a plate of a capacitor 62 which is connected through a diode 63 to the emitter of a transistor 64. The transistor 64 has a collector connected to negative voltage source 65, and a base electrode connected to the collector of another transistor 66. The transistor 66 has a collector connected to output conductor 55 of amplifier 54, and a base electrode connected to a junction of series connected resistors 67 and 68, respectively. The resistors 67 and 68 comprise voltage divider network means connected between a negative voltage source and electrical ground for applying a predetermined negative voltage to the base of transistor 66. Accordingly, when the negative going signal applied to the output conductor 55 exceeds the negative voltage applied to the base of transistor 66, transistor 66 is rendered conductive. As a result, transistor 64 also is rendered conductive thereby permitting the source 65 to charge the connected plate of capacitor 61 negatively. Consequently, the gate electrodes of field-effect transistors 58 and 59, respectively, become more negative and cause a greater negative voltage to be applied to the connected input terminal of amplifier 54. Thus, the gain of amplifier 54 is reduced and the resulting output signal on conductor 55 decreases in magnitude.

The trigger circuit means 40 also may include a comparator 70 having a negative input terminal connected to the output of amplifier 54. A positive input terminal of comparator 70 is connected through a resistor 71 to a wiper arm of a multi-turn potentiometer 72 which provides means for adjusting the trigger voltage level of circuit means 40. The resistive element of potentiometer 72 is connected to the wiper of a calibration potentiometer 74 which is adjusted such that the selected position of potentiometer 72 corresponds to the desired trigger portion of signal supplied by trigger select means 36. As a result, when the negative going output signal produced by amplifier 54 decreases in magnitude to a value less than the selected trigger threshold voltage, the potentiometer 72 predominates and causes comparator 70 to produce a positive going or logic High ouput signal. This High output signal may be converted into a negative going or logic Low output signal by an inverter 76 connected to the output of comparator 70. Thus, the trigger circuit means applies to the output conductor 43 a logic Low signal indicative of a preselected portion of the input signal supplied by the trigger select means 36.

In exposure gate means 44, the output conductor 43 is connected to a trigger input terminal of a timer device 80, which may be of the integrated circuit type, such as Model No. 555 made by Signetics Corporation of Sunnyvale, California, for example. In the delay means 46, the output conductor 43 may be connected to a base electrode of a PNP transistor 82 which has a grounded emitter connected to one terminal of a capacitor 84. The other terminal of capacitor 84 is connected to a movable conductive arm 86 of a relay means 89 having an armature coil 87. When a switching means 90 is actuated from a "three phase" or open position to a "single phase" or closed position, the coil 87 is energized to move the arm 86 into electrical engagement with a relay contact 88. The contact 88 is resistively connected to a positive voltage source 91, and is directly connected to the collector of transistor 82. The contact 88 also is connected through the output conductor 45 to respective threshold and discharge terminals of timing device 80.

Accordingly, with a logic Low signal on conductor 43, the transistor 82 is rendered conductive thereby shorting the positive voltage source 91 to ground. Thus, with the positive bias removed from its threshold and discharge terminals and a logic Low signal applied to its trigger terminal, the timing device 80 produces at its output terminal a positive going or logic High output signal. When the logic Low signal produced by trigger circuit means 40 is completed, the resulting logic High output signal on conductor 43 renders transistor 82 nonconductive whereby the positive voltage source 91 is no longer connected to ground. If the switching means 90 is in the open position, the positive bias voltage from source 91 will be applied immediately to the respective threshold and discharge terminals of timing device 80. As a result, the timing device 80 will cease applying a logic High signal to its output terminal when the logic Low signal from trigger circuit means 40 terminates.

However, if the switching means 90 is in the closed position, the positive voltage source 91 is required to charge capacitor 84 to a predetermined value before applying sufficient voltage to the respective threshold and discharge terminals of timing device 80 to cause termination of the logic High output signal. Consequently, in the three phase mode of operation, the exposure gate means 44 applies to the conductor 49 connected to the output terminal of timing device 80 a logic High signal which terminates when the trigger signal received from trigger circuit means 40 is completed. On the other hand, in the single phase mode of operation, the exposure gate means 44 continues to apply a logic High signal to the output conductor 49 for a predetermined time interval, such as ten milliseconds, for example, after the trigger signal from circuit means 40 is completed.

The delay means 46 also may include an edge pulse operated, one-shot multivibrator 92 having a trigger input terminal connected to the output conductor 43 of trigger circuit means 40. A positive voltage source 93 connected directly to B, Vcc and clear input terminals of multivibrator 92 also is connected through an adjustable resistor 94 to an R/C timing terminal of the multivibrator and to a stationary contact 95 of relay means 89. The contact 95 may be electrically engaged by a movable conductive arm 96 of the relay means thereby connecting the adjustable resistor 94 to one terminal of a capacitor 98 which has an opposing terminal connected to a C terminal of the multivibrator 92. An output terminal Q of the multivibrator 92 is connected through the output conductor 47 to a clock input terminal of a flip-flop 100 in time gate means 48. The flip-flop 100 has an output terminal Q connected to an output conductor 102 of the time gate means 48, and a clear input terminal connected to the output conductor 49 of exposure gate means 44.

Thus, the logic High signal applied to conductor 49 by the exposure gate means 44 enables the flip-flop 100 to apply a logic High output signal to the output conductor 102 when a logic High pulse signal is applied to its clock input terminal. The logic Low signal on conductor 43 will trigger the multivibrator 92 to apply a logic High pulse signal to the clock input terminal of flip-flop 100 when a predetermined positive potential is applied to the R/C timing terminal of multivibrator 92.

Accordingly, if the switching means 90 is in the open position, the source 93 applies the required positive potential directly through the adjustable resistor 94 to the R/C timing terminal of the multivibrator 92. Consequently, the multivibrator 92 immediately applies the logic High pulse signal to the clock terminal of flip-flop 100 thereby causing a logic High signal to be applied to the output conductor 102.

On the other hand, if the switching means 90 is in the closed position, the adjustable resistor 94 is connected in electrical series with the capacitor 98 to provide an RC time delay before the required positive potential is applied to the R/C timing terminal of multivibrator 92. Thus, the logic High pulse signal is not applied to the clock input terminal of flip-flop 100 and the resulting logic High is not applied to output conductor 102 until the RC time delay has expired. Preferably, the resistor 94 is adjusted to provide a time delay, such as ten milliseconds, for example, which is substantially equal to the delay time provided by capacitor 84 for prolonging the logic High signal applied to conductor 49 when switching means 90 is in the closed position. Accordingly, the time interval the logic High pulse is delayed in being applied to the clock terminal of flip-flop 100 is compensated by the logic High signal on conductor 49 enabling the flip-flop 100 to prolong the logic High signal applied to the output conductor 102 for a substantially equal time interval.

The reset means 42 may include a manually operated pushbutton switch 104 which is normally in the open position. The switch 104 is provided with a contact arm 106 which is connected to electrical ground and is movable into engagement with a stationary contact 107. The contact 107 is connected through the output conductor 41 and a resistor 108 in trigger circuit means 40 to the negatively charged plate of capacitor 62. Consequently, when the reset switch 104 is actuated, the contact arm 106 discharges capacitor 62 to ground thereby removing the gain limiting bias from the negative input terminal of amplifier 54. As a result, the trigger circuit means 40 applies to output conductor 43 a logic High signal which deactivates the exposure gate means 44 and the time gate means 48.

The reset switch 104 also includes a contact arm 109 connected to one terminal of a capacitor 110 which has an opposing terminal connected to a positive voltage source 111. In the open position, the arm 109 engages a stationary contact connected to the opposing terminal of capacitor 110 thereby short circuiting the capacitor. In the closed position, the arm 109 is connected to an input terminal of a Nor gate 112 which has a logic High pulse applied thereto as a result of the source 111 charging the capacitor 110. Another input terminal of Nor gate 112 is connected to the output conductor 49 of exposure gate means 44 whereby the fist microsecond of a logic High signal applied to conductor 49 functions as a reset pulse signal similar to the pulse signal provided by capacitor 110.

Thus, with a logic High signal on either one of its input terminals, the Nor gate 112 produces a logic Low signal which is applied to a connected A input terminal of a pulse operated, one-shot multivibrator 114. A positive voltage source is connected to the B and Vcc input terminals of multivibrator 114, and is connected through a resistor 115 to the R/C timing terminal thereof. The resistor 115 is connected in electrical series with a capacitor 116 connected between the R/C and C terminals of the multivibrator. Accordingly, the resistor 115 and series connected capacitor 116 provides a charging time interval for controlling the duration of respective logic High and Low pulse signals applied to the Q and Q output terminals of the multivibrator 114. The logic High and Low output pulse signals are buffered by an amplifier 118 and applied to output conductors 120 and 122, respectively, of the reset means 42.

Figure 3:
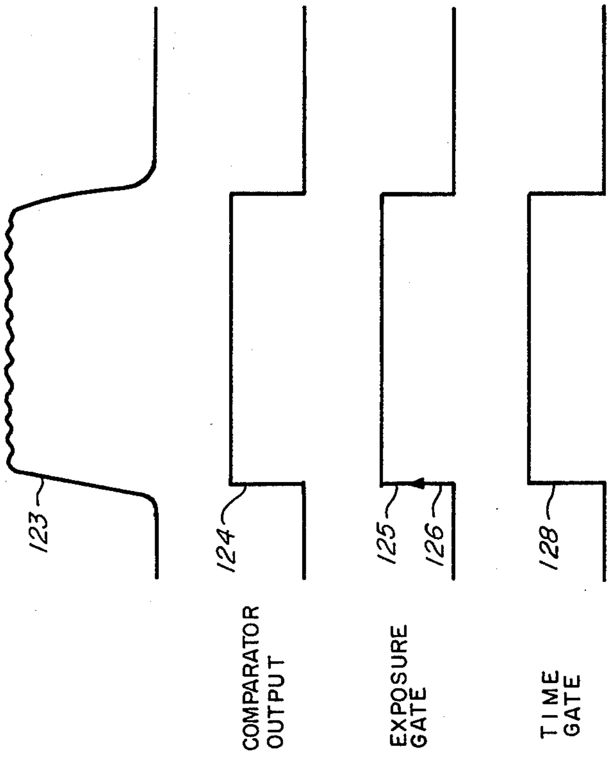
FIG. 3 is a graphical view of the output signal generated in a three phase mode of operation by the trigger circuit means, the exposure gate means, and the time gate means.

Consequently, as shown in FIG. 3, curve 123 has a substantially constant amplitude during an X-ray exposure, and represents a typical three phase waveform signal selected by the trigger select means 36. Curve 124 represents the resulting effective portion of signal 123 produced at the output of means 70 as a logic High signal. Curve 125 is indicative of the resulting logic High output signal applied to the output conductor 49 by the exposure gate means 44, and has a one microsecond leading edge portion indicated by arrow 126 which is used in the reset means 42 for producing reset pulses on the respective output conductors 120 and 122. Curve 128 represents the resulting logic High signal applied to output conductor 102 by the time gate means 48.

Figure 4:
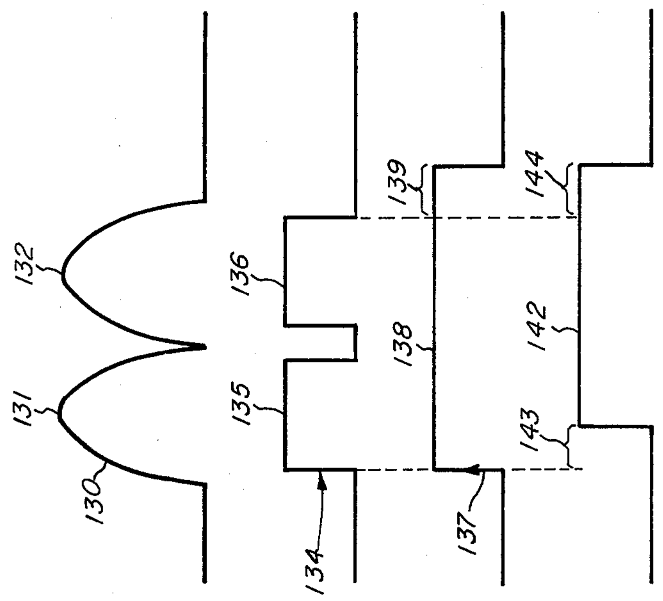
FIG. 4 is a graphical view of the output signal generated in a single phase mode of operation by the trigger circuit means, the exposure gate means, and the time gate means.

As shown in FIG. 4, curve 130 having successive half-wave crests 131 and 132, respectively, is indicative of a typical signal phase waveform signal selected by the trigger select means 36 for an X-ray exposure. Curve 134 represents the resulting time spaced, logic High signals 135 and 136, respectively, produced at the output of comparator means 70. Thus, it may be seen that the exposure gate means 44 and the time gate means 48 may treat the logic High signals 135 and 136 as separate X-ray exposures, when in fact they constitute incremental portions of the same X-ray exposure. Consequently, for the single phase mode of operation, the switching means 90 in delay means 46 is placed in the closed position. Accordingly, at the completion of logic High signal 135, the exposure gate output signal continues to be applied to the output conductor 49 due to the charging time interval provided by capacitor 84 in delay means 46. During this charging time interval, the succeeding logic High signal 136 causes the timing device 80 in exposure gate means 44 to be re-triggered. This process is continued until the comparator means 70 no longer produces logic High signals during the charging time interval provided by capacitor 84.

Thus, curve 138 represents the resulting exposure gate output signal having a one microsecond, leading edge portion 137 for producing reset signals on conductors 120 and 122, respectively, and having a prolonged portion 139 extended beyond the completion of logic High signal 136. Curve 142 represents the resulting time gate output signal having an initial time delay indicated as 143, which is caused by the clock pulse delay action of resistor 94 and series connected capacitor 98 in delay means 46. At the completion of logic High signal 135, the exposure gate output signal 138 enables the flip-flop 100 in time gate means 48 to continue applying a logic High signal to the output conductor 102. During this prolongation of the time gate output signal 142, the succeeding logic High signal 136 causes the one-shot multivibrator 92 in delay means 46 to be re-triggered. This process is repeated until the comparator means amplifier 70 no longer produces logic High signals during the prolonged time interval. Accordingly, the curve 142 has a final prolonged portion 144 which compensates for the initial time delay 143. As a result, the time gate output signal 142 has a duration substantially equal in time to the sum of the effective portions of input signal 130.

Referring again to FIG. 1, the output conductor 32 of current sensing means 28 also is connected through a conductor 150 to one input terminal of a voltage to frequency converter means 152. The output of converter means 152 is connected through a conductor 153 to an input terminal of an And gate 154, which has another input terminal connected to the output conductor 49 of exposure gate means 44. The time gate means 48 is connected through output conductor 102 to one input terminal of And gate 156, which has another input terminal connected through a conductor 158 to the output of a timing means 160. The output of And gate 154 is connected through a conductor 155 to an MAS counter means 162; and the output of And gate 156 is connected through a conductor 157 to a time counter means 164. The MAS counter means 162 and the time counter means 164 are connected through respective pluralities of output conductors to a programming means 166. The output conductors 120 and 122 of reset means 42 are connected to the MAS counter 162 and the time counter 164, respectively.

Figure 5:
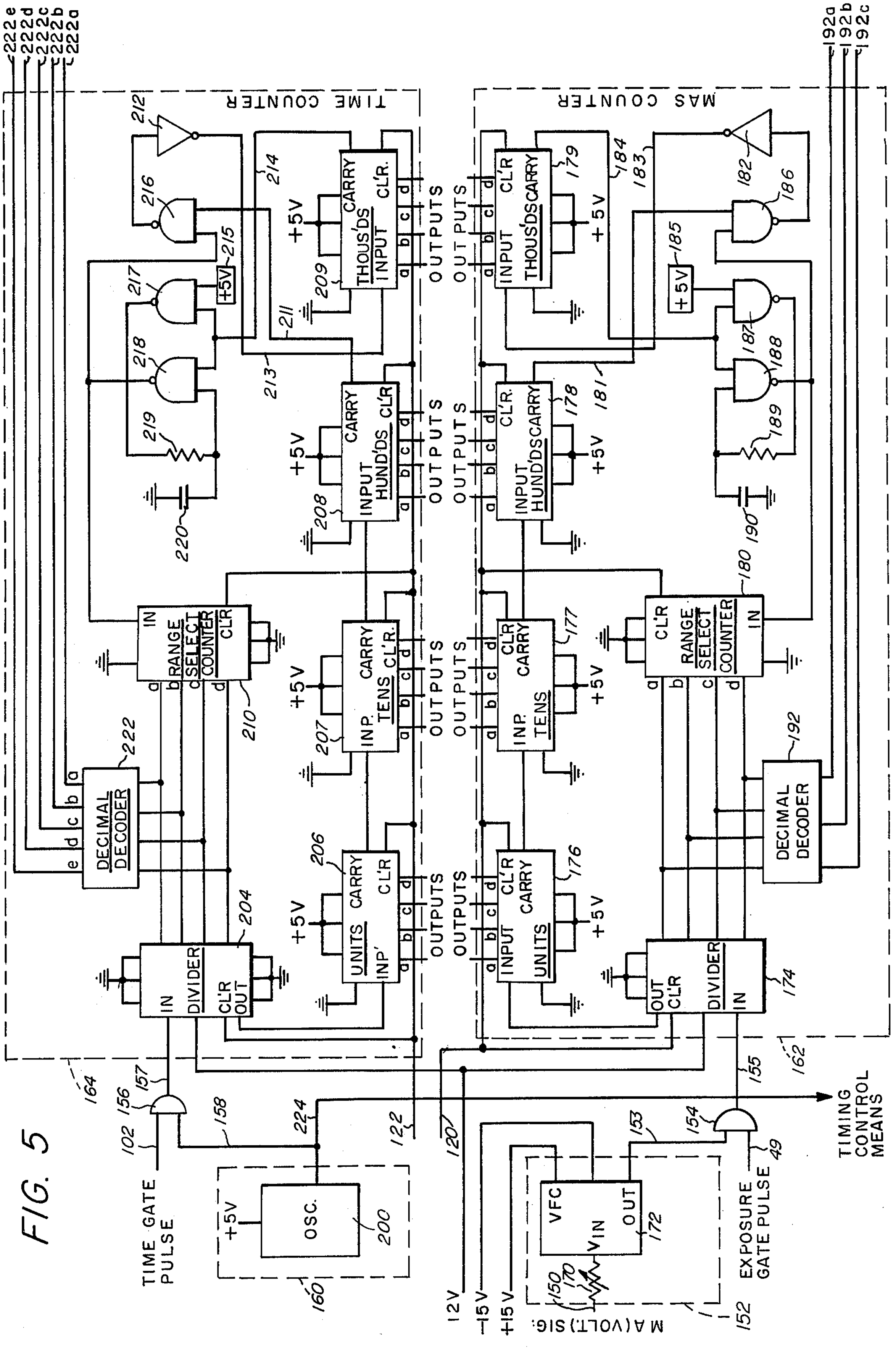
FIG. 5 is a schematic view of the voltage-to-frequency converter means, the MAS counter means, the timing means, and the time counter means shown in FIG. 1.

As shown in FIG. 5, the analog voltage signal proportional to X-ray tube current, such as one millivolt per milliampere (MA) of current, for example, is applied through conductor 150 and an adjustable resistor 170 in the converter means 152 to an input voltage-to-frequency converter device 172. The device 172 may be of a conventional type, such as Model No. 4705 made by Teledyne-Philbrick of Dedham, Massachusetts, for example, which produces at its output terminal a train of pulses having an instantaneous frequency proportional to the instantaneous amplitude of analog voltage signal on conductor 150, such as 100 hertz per millivolt, for example. The output pulse train of the voltage-to-frequency converter 172 is applied through the conductor 153 to an input terminal of And gate 154, which has another input terminal connected to the output conductor 49 of exposure gate means 44. Thus, due to the logic High signal on conductor 49, the And gate 154 is gated "on" to produce a logic High output signal of relatively short duration, such as two microseconds, for example, for each pulse in the train produced by converter means 152. However, when the X-ray exposure terminates, the analog MA signal is no longer applied to the input of the converter 172, and the logic High signal on conductor 49 has an additional prolonged portion. Consequently, the And gate 154 is gated "off" by the converter means 152 so that a train of output pulses is applied through output conductor 155 to the MAS counter 162 only during the X-ray exposure interval.

The MAS counter means 162 may include an auto-ranging, four digit, six decade counter means comprising a programmable divider 174 having an input terminal connected to the output conductor 155 of And gate 154. The output of divider 174 is connected to an input terminal of a units counter 176 having a carry terminal connected to an input of a tens counter 177, which has a carry terminal connected to an input of a hundreds counter 178. A carry terminal of counter 178 is connected through a conductor 181 to an input of a Nand gate 186, which has an output connected through an inverter 182 and a conductor 183 to an input of a thousands counter 179. A carry terminal of counter 179 is connected to input terminals of Nand gates 187 and 188, respectively, the Nand gate 187 having another input terminal connected to a positive voltage source 185. The output of Nand gate 187 is connected through a resistor 189 to another input terminal of Nand gate 188 and to one terminal of a capacitor 190, the opposing terminal of capacitor 190 being connected to electrical ground. The output of Nand gate 188 is connected to another input terminal of Nand gate 186 and to an input terminal of a range selector counter 180. The counter 180 has four output conductors a-d connected to respective input terminals of the divider 174 and also to respective input terminals of a decimal decoder 192, which has output terminals connected to respective output conductors 192*a*, 192*b*, and 192*c* of the MAS counter 162.

The output conductor 120 of reset means 42 carries a logic High reset pulse signal which is initated by the first microsecond of the logic High signal on conductor 49. This reset pulse signal is applied to the clear input terminals of divider 174 and counters 176–180, respectively to override all functions and return them to zero settings prior to receiving the train of output pulses from And gate 154. The function of the divider 174 is to divide the input pulse by a power of ten determined by the range select counter 180. Accordingly, with the range select counter 180 set to zero, the initial pulses are divided by one In the divider 174 before being applied to the input of units counter 176. The counters 176–180 are of the binary coded type which advance one count on the positive going edge of each input pulse and count in binary arithmetic from zero to nine. Also, the counters 176–179 have respective carry output terminals which are maintained High for the first eight counts, then go Low for the ninth count, and go High when receiving the tenth input pulse. Thus, on each tenth input pulse, the counter "overflows" causing the counter to return to zero and generating a carry output pulse for the succeeding counter. Consequently, for every ten input pulses received by the counter 176, the counter 177 receives one input pulse. Similarly, the counter 178 receives an input pulse for every ten pulses received by the counter 177 and every one hundred pulses received by the counter 176.

The counter 179 provides the most significant digit produced by the MAS counter and in combination with Nand gates 186–188, resistor 189, capacitor 190, range select counter 180, and divider 174 constitutes the auto-ranging means of MAS counter 162. Just prior to reaching the count of 9999 pulses, the carry output terminals of the hundreds counter 178 and the thousands counter 179 are maintained at respective logic High levels. Consequently, the input terminals of Nand gates 187 and 188 connected to the carry output terminal of counter 179 are at logic High levels also. Since the other input terminal of Nand gate 187 is maintained at a logic High level by the positive voltage source 185, the Nand gate 187 produces a logic Low output signal which causes capacitor 190 to discharge through resistor 189 thereby applying a logic Low signal to the connected input terminal of Nand gate 188. Accordingly, with the other input terminal of Nand gate 188 at a logic High, it produces a logic High output signal which is applied to connected input terminals of the range select counter 180 and the Nand gate 186, respectively. Thus, with the other input terminal of Nand gate 186 at a logic High, it produces a logic Low signal which is converted to a logic High signal by the inverter 182 and applied to the connected input terminal of counter 179. However, the output of counter 179 remains a logic High until it receives a logic Low input pulse.

When the count of 9999 is reached, the resulting input pulse to counter 178 causes it to apply to its carry output terminal a logic Low signal, which also is supplied to the connected input terminal of Nand gate 186. Consequently, the Nand gate 186 produces a logic High output signal which is converted to a logic Low signal by the inverter 182 and applied to the connected input terminal of counter 179. As a result, the counter 179 produces at its carry output terminal a logic Low signal which is applied to the connected input terminals of Nand gates 186 and 188, respectively. Accordingly, the Nand gate 187 produces a logic High output signal which charges capacitor 190 and applies a logic High signal to the connected input terminal of Nand gate 188. With a logic Low signal now on its other input terminal, the Nand gate 188 still produces a logic High output signal which is applied to the connected input terminals of range select counter 180 and Nand gate 186, respectively. Thus, with the other input terminal at a logic Low, the Nand gate 186 continues to produce a logic High signal which is converted to a logic Low signal by the inverter 182 and applied to the connected input terminal of counter 179.

When the next pulse is received by the counter 178, it returns to zero and applies a logic High signal to its carry output terminal. Thus, with logic Highs on both input terminals, and Nand gate 186 produces a logic Low output signal which is converted to a logic High and applied to the connected input terminal of counter 179. As a result, the counter 179 returns to zero and produc1s at its carry output terminal a logic High signal which causes the Nand gate 187 to produce a logic Low signal for discharging the capacitor 190 through resistor 189. However, during the discharging time interval, the connected input terminal of Nand gate 188 is initially High and then goes Low. Consequently, Nand gate 188 initially produces a logic Low output signal followed by logic High output signal, which signals are applied sequentially to the connected input terminals of range select counter 180 and Nand gate 186, respectively. This Low to High transistion causes the counter 179 and the range select counter 180 to enter respective ones therein.

Prior to the respective one counts being entered into the range select counter 180 and the counter 179, the accumulated count is 99.99 since the decimal point is located after the second digit from the left when the range select counter 180 is reset to zero. However, after the respective one counts are entered in the range select counter 180 and the counter 179, the accumulated count is 100.0 thereby requiring the decimal point to be moved one more digit to the right. Accordingly, the range select counter 180 applies to its respective output terminals *a* - *d* and the connecting conductors four bits of data which cause the divider 174 to start dividing incoming pulses by ten. Consequently, the divider 174 applies one pulse signal to its output terminal for every ten input pulse signals received from And gate 154. In this manner, another decade is added, in effect, to the MAS counter 162 while maintaining the four most significant digits of the total count. Similarly, when another one count is entered into the range select counter 180, the divider 174 will start to divide incoming pulses by one hundred, thereby moving the decimal point one more digit to the right in the total count and, in effect, adding another decade to the MAS counter 162.

The binary coded output data generated by the range select counter 180 for locating the decimal point, also is sent to respective input terminals of the decimal decoder 192. After decoding the received data, the decoder 192 applies a logic Low signal to the appropriate one of its respective output conductors **192*a*, 192*b*, and 192*c*, which are associated with the decimal point being located after the second, third, and fourth digits, respectively, in the total count. These decimal locating output conductors 192*a*-192*c* constitute respective output conductors of the MAS counter 162 which are connected into the programming means 166. The counters 176-179 have respective four bit data output lines 176*a*-176*d*, 177*a*-177*d*, 178*a*-178*d*, and 179*a*-179*d* which constitute respective output conductors of the MAS counter 162 and are connected into the programming means 166. Each set of four bit output lines carries binary coded information relating to the highest digit registered by the associated counter at the completion of the exposure time interval. Thus, the binary coded data carried to the programming means 162 by the output conductors 176*a*-176*d*, 177*a*-177*d*, 178*a*-178*d*, and 179*a*-179*d*** constitutes an integral summation of the X-ray tube current during the exposure interval, and therefore, is equivalent to milliampere-seconds (MAS) of radiation exposure.

The timing means 160 may comprise an oscillator 200, such as Model No. D14C made by Connor-Winfield Corporation of Chicago, Illinois, for example, which provides a train of output pulses having a predetermined frequency such as one megahertz, for example. Oscillator 200 applies the train of output pulses through the conductor 158 to one input terminal of And gate 156, which has another input terminal connected to the output conductor 102 of time gate means 48. Accordingly, due to the logic High signal applied to the conductor 102 by the time gate means 48, the And gate 156 is gated "on" to produce a logic High output signal of relatively short duration, such as two microseconds, for example, for each pulse in the train received from oscillator 200. Also, the And gate 156 is gated "off" by a logic Low signal applied to the output conductor 102 when a time interval equal to the exposure time interval has expired.

The output conductor 157 of And gate 156 is connected into a time counter means 164 which may be substantially identical in structure and operation to the MAS counter means 162. Thus, the time counter means 164 may include an autoranging, four digit, six decade counter means comprising a programmable divider 204 having an input terminal connected to the output conductor 157 of And gate 156. The output of divider 204 is connected to an input of a units counter 206 having a carry output terminal connected to an input of a tens counter 207, which has a carry output terminal connected to an input of a hundreds counter 208. A carry output terminal of counter 208 is connected through a conductor 211 to an input of a Nand gate 216 which has an output connected through an inverter 212 to an input of a thousands counter 209. A carry output terminal of counter 209 is connected to input terminals of Nand gates 217 and 218 respectively, the Nand gate 217 having another input terminal connected to a positive voltage source 215. The output of Nand gate 217 is connected through a resistor 219 to another input terminal of Nand gate 218 and to one terminal of a capacitor 220, the opposing terminal of capacitor 220 being connected to electrical ground. The output of Nand gate 218 is connected to another input terminal of Nand gate 216 and to an input terminal of a range selector counter 210. The counter 210 has four bit output terminals, *a* - *d*, respectively, connected to respective input terminals of the divider 204 and also to respective input terminals of a decimal decoder 222, which has respective output terminals connected to respective output conductors 222*a*, 222*b*, and 222*c* of the time counter means 164.

The output conductor 122 of reset means 42 carries a logic Low reset pulse signal which is initiated by the first microsecond of the logic High signal on the output conductor 49 of exposure gate means 44. This reset pulse signal is applied to the Clear input terminals of divider 204 and counters 206–210, respectively, thereby overriding all functions and returning them to zero settings prior to the logic High gate pulse being applied to conductor 102 by the time gate means 48. Otherwise, the operation of the time counter means 164 is similar to the operation of the MAS counter means 162. Accordingly, the most significant digit counter 209, Nand gates 216–218, respectively, resistor 219, capacitor 220, range select counter 210, and divider 204 constitute an autoranging means for automatically adding decades to the time counter means 164 and locating the decimal point in the accumulated count. Also, the decimal decoder 222 applies a logic Low signal to one of the respective output conductors 222*a*–222*c* for the purpose of locating the decimal point in a display of the total time count. Furthermore, the counters 206, 207, 208, and 209 apply to their output conductors 206*a* - 206*d*, 207*a* - 207*d*, 208*a* - 208*d*, and 209*a* - 209*d*, respectively, four bit data signals which are related to the highest digit entered in the associated counter prior to completion of the logic High gate signal on conductor 102. As a result, the binary coded data carried by these output conductors to the programming means 166 constitutes an integral summation of the time transpired during the X-ray exposure interval.

Referring again to FIG. 1, it may be seen that the output of timing means 160 is connected through a conductor 224 to an input of a timing control means 226, which also has respective input terminals connected to the output conductor 49 of exposure gate means 44 and the output conductors 120 and 122, respectively, of reset means 42. An MA/MAS select means 228 has an output conductor 230 connected through a conductor 232 to another input terminal of the timing control means 226. The programming means 166 receives input signals from the timing control means 226 through conductors 234 and 236, respectively, and sends signals to the timing control means 226 through a conductor 238. Also, programming means 166 sends signals through respective output conductors 240 - 243 to a decoder means 250, which sends signals through conductors 246 and 247 to the timing control means 226 and receives signals therefrom through a conductor 244. The decoder means 250 is connected through a plurality of output conductors, 250*a*–250*n*, to a calculator means 260, which also has three input terminals connected through respective conductors 233, 248, and 249 to the timing control means 226. The calculator means 260 is connected through respective output conductors 260*a*–206*d* to a code converter means 262, which is connected through respective output conductors 262*a*–262*e* to an MA/MAS display means 264. The display means 264 also receives input signals through conductors 266-267 from the calculator means 260, and through conductor 249 from the timing control means 226.

Figure 6:
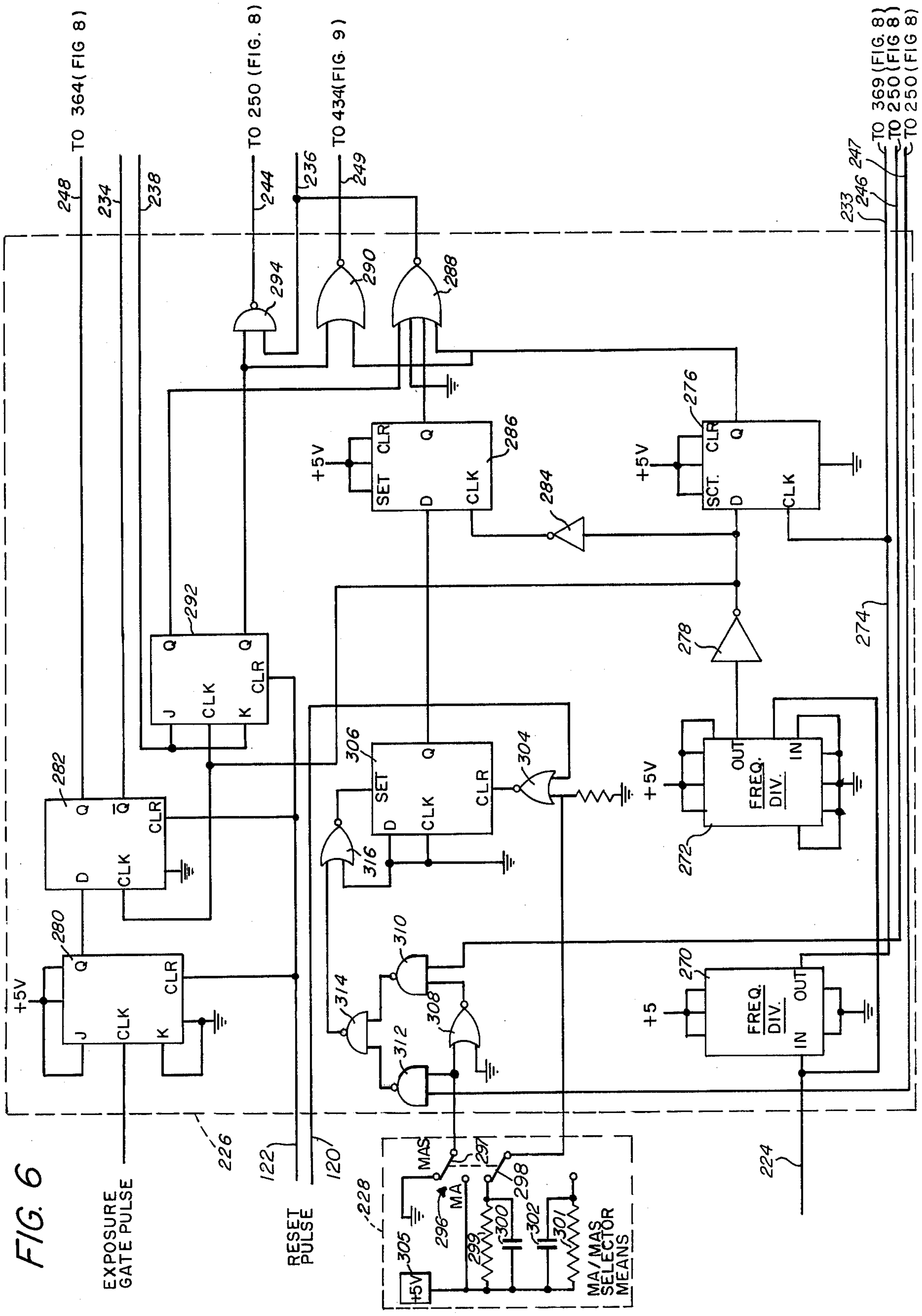
FIG. 6 is a schematic view of the MAS/MA select means and the timing control means shown in FIG. 1.

As shown in FIG. 6, the output conductor 224 of timing means 160 is connected to input terminals of frequency dividers 270 and 272, respectively, in the timing control means 226. The frequency divider 270 may comprise a counter, such as Model No. 74193 made by Texas Instruments, Inc. of Dallas, Texas, for example, which produces an output pulse for every four input pulses thereby converting the one megahertz input signal from oscillator 200 into a two hundred and fifty kilohertz square wave output signal. The output of frequency divider 270 is connected through a conductor 274 to a clock input terminal of a flip-flop 276, and through the output conductor 233 to the calculator means 260. The frequency divider 272 may comprise a counter, such as Model No. MK5009 made by Mostek, Inc. of Carrolton, Texas, for example, which converts the one megahertz signal from oscillator 200 into a ten hertz, square wave output signal.

The output of frequency divider 272 is connected to an inverter 278 which has an output connected to clock input terminals of flip-flops 282 and 292, respectively, and through another inverter 284 to a clock input terminal of a flip-flop 286. The inverted output signal from frequency divider 272 also is applied to a D input terminal of the flip-flop 276. However, since a pulse of the inverted ten hertz signal is applied to the D input terminal simultaneously or slightly later than a pulse of the two hundred and fifty kilohertz signal is applied to the clock terminal, the flip-flop 276 is delayed in producing a corresponding output pulse until the next clock pulse is applied. As a result, the flip-flop 276 produces at its Q output terminal a ten hertz square wave signal, each pulse of which is delayed by four microseconds relative to the corresponding input pulse received from frequency divider 272. This "delayed" ten hertz output signal is applied to connected input terminals of Nor gates 288 and 290, respectively.

The output conductor 49 of exposure gate means 44 is connected to the clock input terminal of flip-flop 280, which has an output terminal Q conncted to an input terinal D of flip-flop 282. The flip-flop 282 has output Q terminals Q and Q connected to respective output conductors 248 and 234, which are connected to the calculator means 260 and the programming means 166, respectively. The output conductor 122 of reset means 42 is connected to Clear input terminals of flip-flops 280, 282, and 292, respectively, and carries a logic Low signal which clears these flip-flops during the first microsecond of the X-ray exposure interval. Consequently, during the X-ray exposure interval, a logic Low signal is applied to the output conductor 248, and a logic High output signal is applied to the output conductor 234. At the completion of the exposure interval, the resulting logic Low signal on conductor 49 causes flip-flop 280 to apply a logic High signal to the connected input terminal of flip-flop 282. As a result, when the next positive going edge of the inverted ten hertz signal is applied to its clock terminal, the flip-flop 282 applies a logic High signal to the output conductor 248, and a logic Low output signal to the output conductor 234.

The flip-flop 292 has respective J and K input terminals connected to the conductor 238 which carries a logic Low signal when the programming means 166 does not detect the presence of a decimal point. Accordingly, with a positive going edge of the inverted ten hertz signal applied to its clock input terminal, the flip-flop 292 produces on its Q output terminal a logic Low signal which is applied to a connected input terminal of Nor gate 288. The flip-flop 292 also produces on its Q output terminal a logic High signal which is applied to connected input terminals of a Nand gate 294 and the Nor gate 290, respectively, the latter having applied to its other input terminal the "delayed" ten hertz signal from flip-flop 276. The other input terminal of Nand gate 294 is connected to the output of Nor gate 288 and to the output conductor 236, which is connected to the programming means 166. The output of Nand gate 294 is connected to the output conductor 244 which is connected to the decoder means 250; and the output of Nor Gate 290 is connected to the conductor 249 which is connected to the calculating means 260.

The MA/MAS select mean may comprise a double pole switch 296 having movable contact arms 297 and 298, respectively. When the switch 296 is in the MAS position, the contact arm 297 is connected to electrical ground; and the contact arm 298 is connected through a parallel resistor 299 and capacitor 300 network to a positive voltage source 305. When the switch 296 is in the MA position, the contact arm 297 is connected directly to the positive voltage source 305; and the contact arm 298 is connected through a parallel resistor 301 and capacitor 302 network to the positive voltage source 305. The contact arm 298 is connected to an input terminal of a Nor gate 304 which has another input terminal connected to the output conductor 120 of reset means 42. The output of Nor gate 304 is connected to the Clear input terminal of a flip-flop 306. Accordingly, during the first microsecond of the exposure gate pulse on conductor 49, the conductor 120 carries a logic High pulse which causes Nor gate 304 to produce a logic Low signal for clearing the flip-flop 306. The flip-flop 306 also may be cleared by actuating switch 296 to reconnect the contact arm 298 to either capacitor 300 or 302, which then will be charged by the source 305 to apply a logic High signal to the connected input terminal of Nor gate 304. As a result, the Nor gate 304 will produce the logic Low signal which will clear the flip-flop 306.

The arm 297 of switch 296 is connected to an input terminal of a Nor gate 308 having another input terminal connected to electrical ground, and an output terminal connected to an input of a Nand gate 310. Another input terminal of Nand gate 310 is connected to the conductor 246, which carries a logic Low signal when a logic High "divide" signal is not applied thereto by the decoder means 250. Switch arm 297 also is connected to an input terminal of a Nand gate 312 having another input terminal connected to the conductor 247, which carries a logic Low signal when a logic High "equals" signal is not applied thereto by the decoder means 250. The output terminals of Nand gates 310 and 312 are connected to respective input terminals of a Nand gate 314, which has an output terminal connected to an input terminal of a Nor gate 316. The Nor gate 316 has another input terminal connected to electrically grounded D and clock input terminals of the flip-flop 306, which has a set input terminal connected to the output of Nor gate 316. The flip-flop 306 has an output terminal connected to an input terminal D of the flip-flop 286, which has an output terminal Q connected to a respective input terminal of the Nor gate 288.

Accordingly, with the switch 296 in the MAS position, the Nor gate 308 produces a logic High output signal which is applied to the connected input terminal of Nand gate 310. Also, with a logic Low (no "divide" command) signal on the other input terminal of Nand gate 310, it produces a logic High signal which is applied to the connected input terminal of Nand gate 314. Furthermore, with a logic Low (no "equals" command) signal on the input terminal of Nand gate 312 connected to conductor 247, it also produces a logic High signal which is applied to the other input terminal of Nand gate 314. As a result, the Nand gate 314 produces a logic Low signal which is applied to the connected input terminal of Nor gate 316. Since the other input terminal of Nor gate 316 is connected to electrical ground, it produces a logic High signal which is applied to the connected input terminal of flip-flop 306. With the flip-flop 306 cleared by a logic Low signal from the Nor gate 304, it produces at its output terminal Q a logic Low signal which is applied to the connected input terminal of flip-flop 286. Consequently, with a positive going edge of the ten hertz signal applied to its clock terminal, the flip-flop 286 produces a logic Low output signal which is applied to the connected input terminal of Nor gate 288.

Since the flip-flop 282 has been cleared and a logic Low (no "decimal" command) signal is applied to its J and K input terminals, the flip-flop 282, as previously described, produces at its Q output terminal a logic Low signal which is applied to a second input terminal of Nor gate 288. Thus, with a third input terminal connected to electrical ground, the Nor gate 288 produces at its output terminal a square wave signal corresponding to the "delayed" ten hertz signal applied to its fourth input terminal by the flip-flop 276. This ten hertz output signal produced by Nor gate 288 is applied through the connecting output conductor 236 to the programming means, wherein it is used for counting purpose to regulate the operation of the programming means. The output of Nor gate 288 also is connected to an input terminal of a Nand gate 294 which has another input terminal maintained at a logic High by the connected Q output terminal of flip-flop 292. Consequently, the Nand gate 294 produces a ten hertz output signal which is inverted with respect to the ten hertz input signal from Nor gate 288. This ten hertz output signal produced by the Nand gate 294 is applied through the connecting output conductor 244 to the decoder means 250, wherein it is used for simulating the pressing and releasing of a keyboard "on-off" switch. The Nor gate 290 also has an input terminal receiving the "delayed" ten hertz output signal from the flip-flop 276. However, since its other input terminal is maintained at a logic High level by the connected Q output terminal of flip-flop 292, it applies a constant logic Low signal through the connecting output conductor to the calculating means 260.

Figure 7:
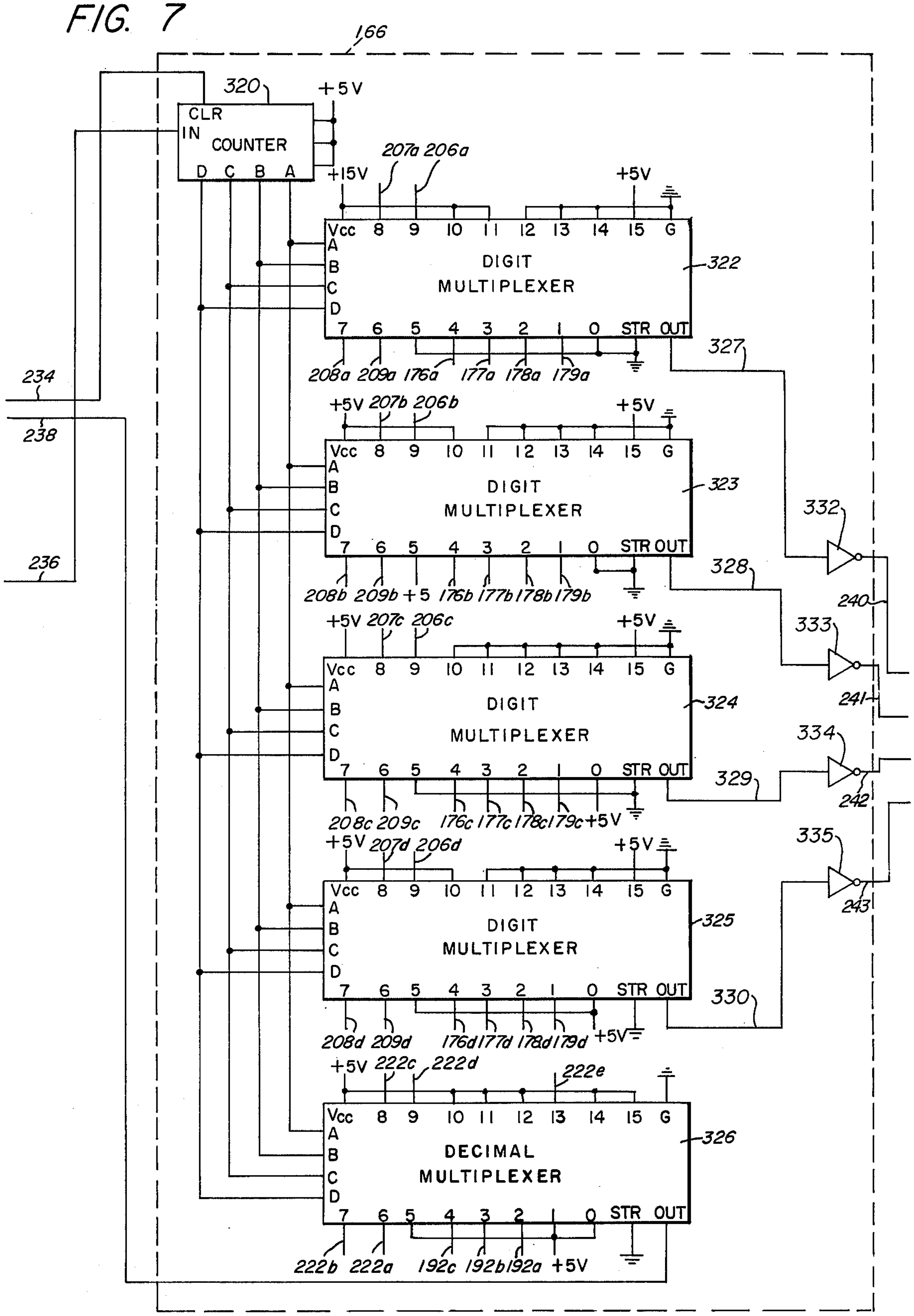
FIG. 7 is a schematic view of the programmer means shown in FIG. 1.

As shown in FIG. 7, the programming means 166 may include a program counter 320 havng its Clear and input terminals connected to the output conductors 234 and 236, respectively, of the timing control means 226. The program counter 320 may be provided with four output terminals A–D, respectively, which are connected to similarly designated input terminals of five multiplexers 322–325, respectively. Each of the multiplexers 322–326 has sixteen input channels which are selected sequentially when the program counter 320 is counting. Corresponding channels of the multiplexers 322–326 are numbered from one to fifteen, respectively, and are selected simultaneously when the program counter 320 counts to the associated number.

The digit multiplexers 322–325 have respective number one to number four channels connected to the data bit output conductors of the MAS counter means 162. The respective number one input channels of multiplexers 322–325 are connected to the four output conductors 179a–179d of the most significant digit counter 179, and so on, to the respective number four channels which are connected to the four output conductors 176a–176d of the least significant digit counter 176. The digit multiplexers 322–325 have respective number six to number nine channels connected to the data bit output conductors of the time counter means 164. The respective number six channels are connected to the four output conductors 209a–209d of the most significant digit counter 209, and so on, to the respective number nine channels which are connected to the four output conductors 206a–206d of the least significant digit counter. Each of the digit multiplexers 322–325 has an output terminal connected through a respective conductor 327–330 and a respective buffer inverter 332–335 to a respective output conductor 240–243, which are connected to the decoder means 250.

Since the output conductor 234 of timing control means 226 carries a logic High signal during the X-ray exposure interval, the program counter 320 is cleared and maintained at zero, while the respective MAS counters 176–179 and the respective time counters 206–209 are storing binary coded digital data. With the program counter 320 at a count of zero, the multiplexers 322–326 select their zero channels for connection to their respective output conductors 240–243 and 238. The digit multiplexers 322–325 have hardwired to the inputs of their respective zero channels four bits of binary coded data corresponding to the number "twelve" which is routed through output conductors 241–243, respectively, to the decoder means 250.

At the completion of the exposure interval, there is applied to the conductor 234 a logic Low signal which enables the program counter 320 to start counting with the next logic High applied to its input terminal by the ten hertz signal on conductor 236. Consequently, with the counter 326 advances to a count of one, the multiplexers 322–326 select their respective number one input channels for connection to their associated output conductors 240–243 and 238, respectively. The digit multiplexers 322–328 have applied to their respective one input channels the four bits of binary coded data corresponding to the highest digit counted by the MAS counter 179 during the exposure interval. Accordingly, these four bits of data are applied through output conductors 240–243, respectively, to the decoder means 250. Similarly, when the counter 320 passes through counts two, three, and four, the four bits of data stored in MAS counters 178,177, and 176, respectively, are routed sequentially through the output conductors 240–243 to the decoder means 250. However, when the counter 320 advances to a count of five, there is hardwired to the number five input channels of digit multiplexers 322–325, respectively, four bits of coded data corresponding to a binary number "ten" which is applied through the associated output conductors 240–243 to the decoder means 250.

Figure 8:
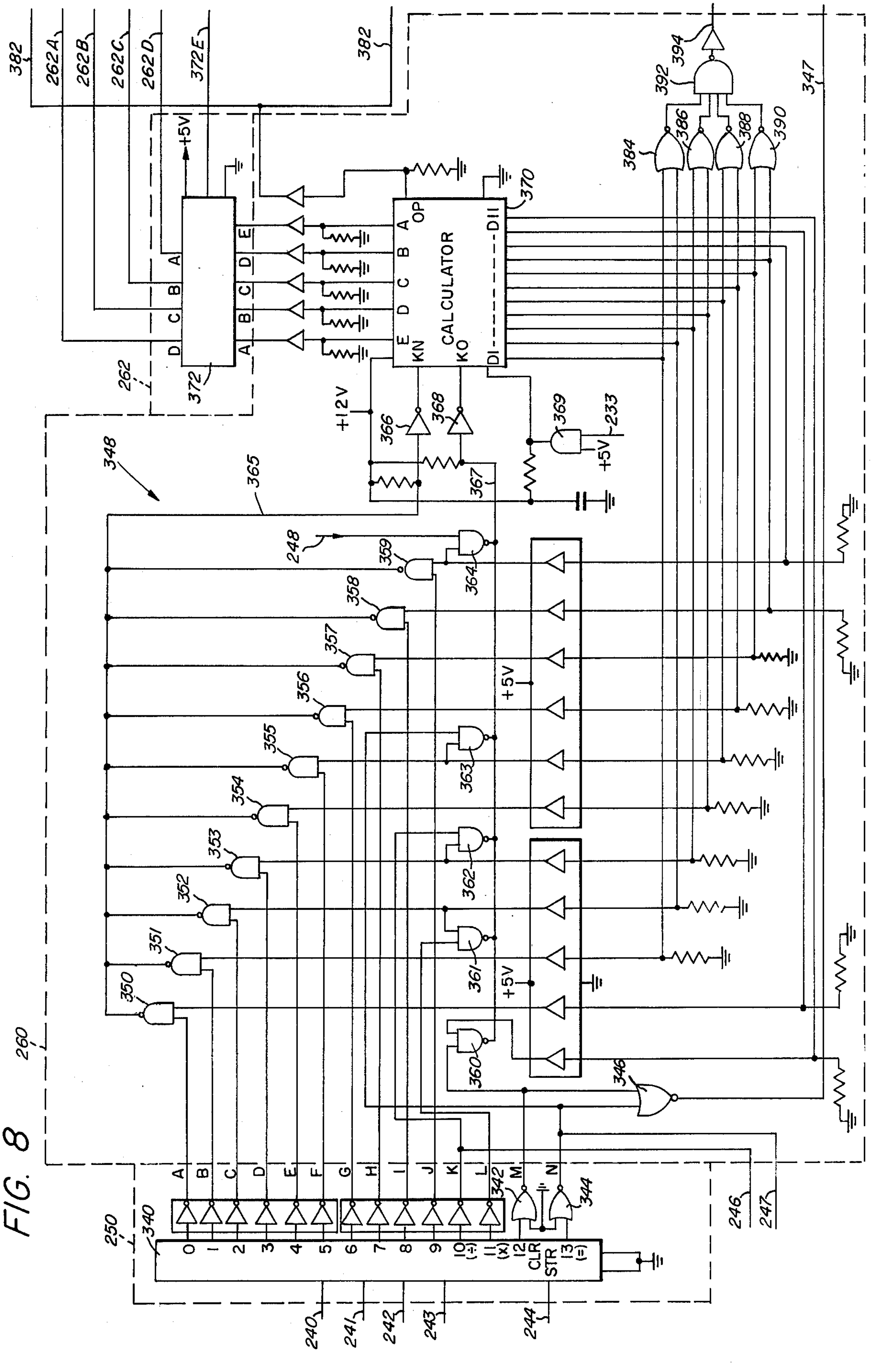
FIG. 8 is a schematic view of the decoder means, the calculator means and the code converter means shown in FIG. 1.

As shown in FIG. 8, the decoder means 250 may comprise a decoder device 340 having respective input terminals connected to the conductors 240–243 and a strobe input terminal connected to the output conductor 244 of the timing control means 226. The conductor 244 carries a ten hertz, square wave signal which applies alternate logic High and logic Low signals of predetermined durations, such as fifty milliseconds, for example, to the strobe input terminal of the decoder device 340. When a logic High signal is applied to its strobe input terminal, the decoder device 340 maintains all of its output terminals 0–13, respectively, at a logic High level. However, when a logic Low signal is applied to its strobe terminal, the decoder device 340 is enabled to decode input binary data from the programming means 166, and apply an associated logic Low signal to a corresponding one of its output terminals 0–13. Thus, the decoder device 340 is activated by logic Low signals on conductor 244, while the program counter is activated by logic High signals on conductor 236. However, since the ten hertz signal on conductor 244 is inverted with respect to the ten hertz signal on conductor 236 by the Nand gate 294 (FIG. 6), the program counter 320 and the decoder device 340 are activated simultaneously during the same alternate fifty millisecond intervals. As a result, a four bit binary coded signal selected from associated input terminals of digit multiplexers 322–325, respectively, is decoded and appears as a logic Low signal on a corresponding numbered output terminal of the device 340 during the same fifty millisecond time interval.

The output terminals zero to nine of decoder device 340 represent the corresponding digit numbers which are entered into the calculator means 260, while the output terminals ten, eleven, twelve, and thirteen represent "divide", "multiply", "clear", and "equals" command signals, respectively. The output zero to eleven of decoder device 340 are connected through respective inverters to output conductors 250A–250Z of the decoder means 250. Output terminals twelve and thirteen of the decoder means 340 are connected to input terminals of Nand gates 342 and 344, respectively, each of which has another input terminal connected to electrical ground. The outputs of Nand gates 342 and 344 are connected to respective output conductors 250M and 250N of the decoder means 250. The output conductor 250K, which is connected to the "divide" command terminal ten of decoder device 340, is connected to the input conductor 246 of the timing control means 266 (FIG. 6). Also, the output conductor 250N, which is connected to the "equals" command terminal thirteen of decoder device 340, is connected to the input conductor 247 of the timing control means 226.

As stated previously, when the program counter 320 advances to a count of five, a binary coded number "ten" is routed through the respective output conductors 240–243 to the decoder means 250 where it is applied to respective input terminals of the decoder device 340. Consequently, with a logic Low pulse signal on its strobe input terminal, the decoder device 340 applies to its "divide" command terminal ten a logic Low signal, which is converted to a logic High signal by the connected inverter and applied to the input conductor 246 of timing control means 226. Also, since the decoder device 340 has not received from programming means 166 a binary coded number "thirteen", the "equals" command terminal thirteen remains at a logic High, which is converted to a logic Low signal by the connected Nor gate 344 and applied to the input conductor 247 of timing control means 226.

Referring to FIG. 6, with the logic Low signal still on conductor 247 and the switch 290 in the MAS position, the Nand gate 312 continues to apply a logic High signal to the connected input terminal of Nand gate 314. However, with a logic High signal now on conductor 246, the Nand gate 310 applies a logic Low signal to the connected input terminal 314. As a result, Nand gate 314 produces a logic High signal, which causes Nor gate 316 to produce a logic Low signal and reset flip-flop 306. Consequently, a logic Low signal is applied to the D input terminal of flip-flop 286; and with the next logic High pulse applied to its clock terminal, the flip-flop 286 produces a logic High output signal which disables Nor gate 288. Accordingly, Nor gate 288 applies a constant logic Low signal to the connected input terminal of Nand gate 294, and through conductor 236 to the input terminal of program counter 320. Thus, with its other input terminal at a logic Low, the Nand gate 294 produces a logic High signal which is applied through conductor 244 to the strobe terminal of decoder device 340, thereby deactivating the device. Also, the program counter 320 does not advance beyond the count of five, since the ten hertz signal applied by flip-flop 276 to the connected input of Nor gate 288 is delayed by four microseconds with respect to the hertz signal applied to the clock terminal of flip-flop 276.

As previously described, if the MA/MAS switch 296 is actuated to the MA position, the charging of capacitor 302 by the source 305 produces a logic High pulse at the input terminal of Nor gate 304 connected to the switch arm 298. Consequently, the Nor gate 304 produces a logic Low signal which clears flip-flop 306 and causes it to apply a logic Low signal to the D input terminal of the flip-flop 286. Accordingly, with the next logic High applied to its clock terminal, the flip-flop 286 applies a logic Low signal to the connected input terminal of Nor gate 288 four microseconds before the corresponding logic Low signal is applied by the flip-flop 276 to its connected input terminal of Nor gate 288. As a result, the Nor gate 288 produces a ten hertz, square wave output signal which is applied to the connected input terminal of Nand gate 294 and through conductor 236 to the input terminal of program counter 320. Thus, the Nand gate 294 produces an inverted ten hertz, key simulating signal which is applied though the conductor 294 to the strobe terminal of decoder device 340. And the program counter 320 commences to count six to fifteen thereby causing the multiplexers 322–326 to select their correspondingly numbered input channels.

When the program counter 320 counts from six to nine, the digit multiplexers 322–325 sequentially select four bit binary coded data corresponding to the highest digits stored in time counters 209, 208, 207, and 206, respectively, and rout it to the decoder device 340. As a result, the decoder device 340 sequentially applies logic Low signals to its correspondingly numbered output terminals. However, since the time counter means 164 measures time in milliseconds, the result of the division operation must be multiplied by one thousand to convert it to milliamperes (MA). Accordingly, hardwired to respective ten input channels of digit multiplexers 322–325 is a binary coded number "eleven" which is routed to decoder device 340 when the counter 320 advances to a count of ten. Consequently, the decoder device 340 applies a logic Low signal to its "multiply" command terminal eleven. Similarly, when the counter 320 advances to a count of eleven, the digit multiplexers send a binary coded number one to the decoder device 340 which then applies a logic Low signal to its number one output terminal. Also, when the counter 320 advances from count eleven to a count of fourteen, the digit multiplexers 322–325 send respective binary coded zeros to the decoder device 340 which applies three logic Low signals, in sequence, to its zero output terminal. When the counter 320 advances to the count of fifteen, the digit multiplexers 322–325 send a binary coded number thirteen to the decoder device 340, which applies then a logic Low signal to its "equals" command terminal thirteen. Thus, the binary coded data stored in the MAS counters 176–179, the time counters 206–209, and the digit multiplexers 322–325 have been decoded by the decoder means 250 and converted into suitable signals for entry into the calculating means 260.

The logic Low signal on the "equals" command terminal thirteen of decoder device 340 is converted to a logic High signal by the connected Nor gate 344 and applied to input conductor 247 of the timing control means 226. Referring again to FIG. 6, with the MA/MAS switch 296 still in the MA position and a logic High "divide" command signal still on conductor 246, the Nand gate 310 continues to apply a logic High signal to the connected input terminal of Nand gate 314. However, with the logic High "equals" command signal on conductor 247, the Nand gate 312 now applies a logic Low signal to the connected input terminal of Nand gate 314. Consequently, Nand gate 314 applies a logic High signal to the connected input terminal of Nor gate 316, which causes it to produce a logic Low output signal and reset flip-flop 306. As a result, a logic Low signal is again applied to the D input terminal of flip-flop 286; and with the next logic High pulse applied to its clock terminal, the flip-flop 286 produces a logic High output signal which disables Nor gate 288. Accordingly, Nor gate 288 applies a constant logic Low signal to the connected input terminal of Nand gate 294, and through conductor 236 to the input terminal of program counter 320. Thus, the Nand gate 294 produces a constant logic High output signal which deactivates the decoder device 340; and the program counter 320 stops at the count of fifteen due to the constant logic Low signal on conductor 236.

It should be noted at this time that if the MA/MAS switch 296 now is actuated back to the MAS position; the charging of capacitor 300 will produce a logic High signal on the input terminal of Norgate 304 connected to the switch arm 298. As a result, the Norgate 304 will produce a logic Low signal which will clear flip-flop 306 and cause a logic Low signal to be applied to the D input terminal of flip-flop 286. Consequently, with the next logic High pulse to its clock terminal, the flip-flop will apply a logic Low signal to the connected input terminal of Nor gate 288 thereby enabling it to produce the ten hertz square wave output signal. Accordingly, Nand gate 294 will produce the ten hertz, key simulating signal for strobing the decoder device 310. Also, the program counter will commence counting by returning to zero and counting to five again. Thus, the digit multiplexers 322–325 will select only the binary coded digits stored in the MAS counters 176–179 and enter it into the decoder device 340. It should also be noted at this time that the frequency divider 270 applies its two hundred and fifty kilohertz output signal to the conductor 233 which is connected into the calculating means 260.

As shown in FIG. 8, the conductor 233 is connected to an input terminal of a Nand gate 369 which has its other input terminal connected to a positive voltage source. Consequently, the Nand gate 369 produces a two hundred and fifty kilohertz output signal which is applied to a P input terminal of a calculator 370. The calculator 370 has a KN input terminal connected through an inverter 366 to a conductor 365, which is connected to output terminals of respective Nand gates 350–359. The Nand gates 350–359 comprise one row of a keyboard simulator means 348, and have respective input terminals connected through buffers to scanning lines $D_{10}$ and $D_1$–$D_9$, respectively, of the calculator 370. The other input terminals of Nand gates 350–359 are connected through respective output conductors 250A – 250J of the decoder means 250 and through respective inverters to the output terminals zero to nine, respectively, of the decoder device 340.

Thus, as described, when the strobe signal on conductor 244 is at a logic Low for fifty milliseconds, the decoder device may apply to one of its output terminals zero to nine, respectively, a logic Low signal, which is inverted to a logic High signal and applied to the connected input terminal of the associated Nand gate. The calculator 370 sequentially applies logic High signals to the scanning lines $D_1$–$D_{11}$, whereby the Nand gate having the logic High signal on its other input terminal produces a logic Low signal, which is inverted to a logic High and applied to the KN input terminal of calculator 370. Thus, the strobe signal on conductor 244 simulates the pressing of a key for fifty milliseconds to enter a number into the calculator 370 and then releasing the key for fifty milliseconds. In this manner, the digits stored in the MAS counters 176–179 are entered sequentially into the calculator 370, and also the digits stored in the time counters 206–209 when the MA/MAS switch is in the MA position.

The calculator 370 also has a KO input terminal connected through an inverter 368 and a conductor 367 to output terminals of Nand gates 360–364, respectively, which also have respective input terminals connected to the scanning lines $D_1$–$D_{11}$ of the calculator. The other output terminals of Nand gates 360–363 are connected to the "clear", "multiply", "divide", and "equals" command output terminals, respectively, of the decoder device 340. Consequently, when the calculator 370 is applying logic High signals to the scanning lines $D_1$–$D_{11}$, it also permits instructions to be entered into its KO input terminal for processing subsequent data entering its KN terminal. Thus, when the MA/MAS switch 296 is in the MAS position, the digits stored in the MAS counters 170–176 are entered sequentially into the KN terminal of calculator 370 and are displayed, even though a subsequent "divide" signal is entered for the purpose of deactivating the program counter 320 and the decoder device 340. However, when the MA/MAS switch 296 is in the MA position, the accumulated quantity from the MAS counters 179–176 is divided by the accumulated quantity entered from the time counters 209–206 subsequent to entering the "divide" command signal into calculator 370. Similarly, the resulting quantity is multiplied by the number one thousand which is entered subsequent to entering the "multiply" command signal. The final quantity is numerically displayed when an "equals" command signal is entered into the calculator 370.

The Nand gate 364 provides means for entering a decimal point into the calculator 370 simultaneously with the digit which precedes it in the associated accumulated quantity. Thus, Nand gate 364 has an input terminal connected to the output conductor 249 of the timing control means 226. Referring to FIG. 6, the conductor 249 is connected to the output of Nor gate 290 which has applied to one of its input terminals the "delayed" ten hertz signal produced by flip-flop 276. The other input terminal of Nor gate 290 is connected to the Q output terminal of flip-flop 292 which has applied to its clock terminal the ten hertz signal produced by frequency divider 272. Connected to the J and K input terminals of flip-flop 292 is the output conductor 238 of the decimal multiplexer 326 in programming means 166. As shown in FIG. 7, the respective output lines 192*a*–192*c* of the decimal decoder 192 (FIG. 5) are selected for connection to the output conductor 238, when the second, third, and fourth digits, respectively, of the stored MAS quantity are selected by the digit multiplexers 322–325. Also, the respective output lines 222*a*–222*d* are selected for connection to the output conductor 238, when the first, second, third, and fourth digits, respectively, of the stored time quantity are selected by the digit multiplexers 322–325. Thus, the decimal points in the accumulated MAS and time quantities respectively, are stored in parallel with the preceding digit of the associated quantity.

Accordingly, when a decimal point is sensed by the multiplexer 326, a logic High signal is applied to the output conductor 238 when the preceding digit is routed to the decoder device 340. The logic High on conductor 238 is applied to the J and K input terminals of flip-flop 292 (FIG. 6), which occurs four microseconds after a logic Low pulse has been applied to the clock terminal of flip-flop 292. When the next logic Low pulse is applied to its clock terminal, flip-flop 202 "toggles" by applying a momentary logic High signal to the connected input terminal of Nor gate 288 thereby disabling it and stopping the program counter 320. Also, the Nor gate 288 applies a logic Low signal to the connected input of Nand gate 294 which now has a logic Low signal applied to its other input terminal. As a result, Nand gate 294 produces a logic High signal which disables the decoder device 340 by causing logic High signals to be applied to all of its output terminals. Consequently, the decoder device 340 cannot enter data into the calculator 370 during this "toggle" interval.

The logic Low signal on the Q output terminal of Nand gate 294 also is applied to a connected input terminal of the Nor gate 290. Consequently, four microseconds later, when the other input terminal of Nor gate 290 goes Low, the Nor gate 290 produces a logic High signal which is applied through the conductor 249 to the connected input terminal of Nand gate 364's calculating means 260 (FIG. 8). Accordingly, when a logic High signal is applied to the associated scan line $D_9$, the Nand gate 364 produces a logic Low "decimal" command signal which is inverted to a logic High and applied to the KO input terminal of the calculator 370. Thus, the decimal point is entered into the calculator 370 after the associated digit which precedes it in the accumulated count. When the next logic Low pulse is applied to the clock terminal of flip-flop 292, it "toggles" back by applying a logic High signal to its Q output terminal thereby disabling Norgate 290, and a logic Low signal to its Q output terminal thereby enabling Nor gate 288. Accordingly, four microseconds later, the "delayed" ten hertz signal produced by flip-flop 276 goes Low, and Nor gate 288 produces a ten hertz, square wave signal which causes the program counter 320 to resume counting. Also, Nand gate 294 is enabled to produce a ten hertz, key simulating signal which re-activates the decoder device 340 to enter the next digit following the decimal point into the calculator 370.

Referring again to FIG. 8, the calculator 370 produces respective seven segment digit signals which are applied serially to buffered output conductors 260A–260E, respectively, of the calculating means 260. The conductor 260A–260E are connected to respective input terminals of a code converting means 262 which may comprise a programmed read-only memory (PROM) module 372. The PROM module 372 converts the seven segment digits produced by the calculator 370 into respective binary coded signals which are applied serially through output conductors 262A–262D, respectively, to the display means 264. An output conductor 372E of the display means 264 is connected to another input terminal of the PROM 372. A decimal point signal associated with the seven segment digits produced by the calculator 370 is applied to an DP output terminal thereof and passes through a connected conductor 382 into the display means 262. Scanning lines $D_1$–$D_8$ of the calculator 370 are paired and connected to respective input terminals of Nor gates 384, 386, 388, and 390, respectively, each of which has an output connected to a respective input of a Nand gate 392. The output of Nand gate 392 is buffered and connected to an output conductor 394 which carries to the display means 264 a train of logic High pulses representative of the logic High signals applied sequential to the scanning lines $D_1$–$D_8$ by the calculator 370. Also, the "clear" and "equals" command output terminals of decoder device 340 are connected through respective Nor gates 342 and 344 to respective input terminals of a Nor gate 346, which has its output terminal connected through a conductor 347 to the display means 264.

Figure 9:
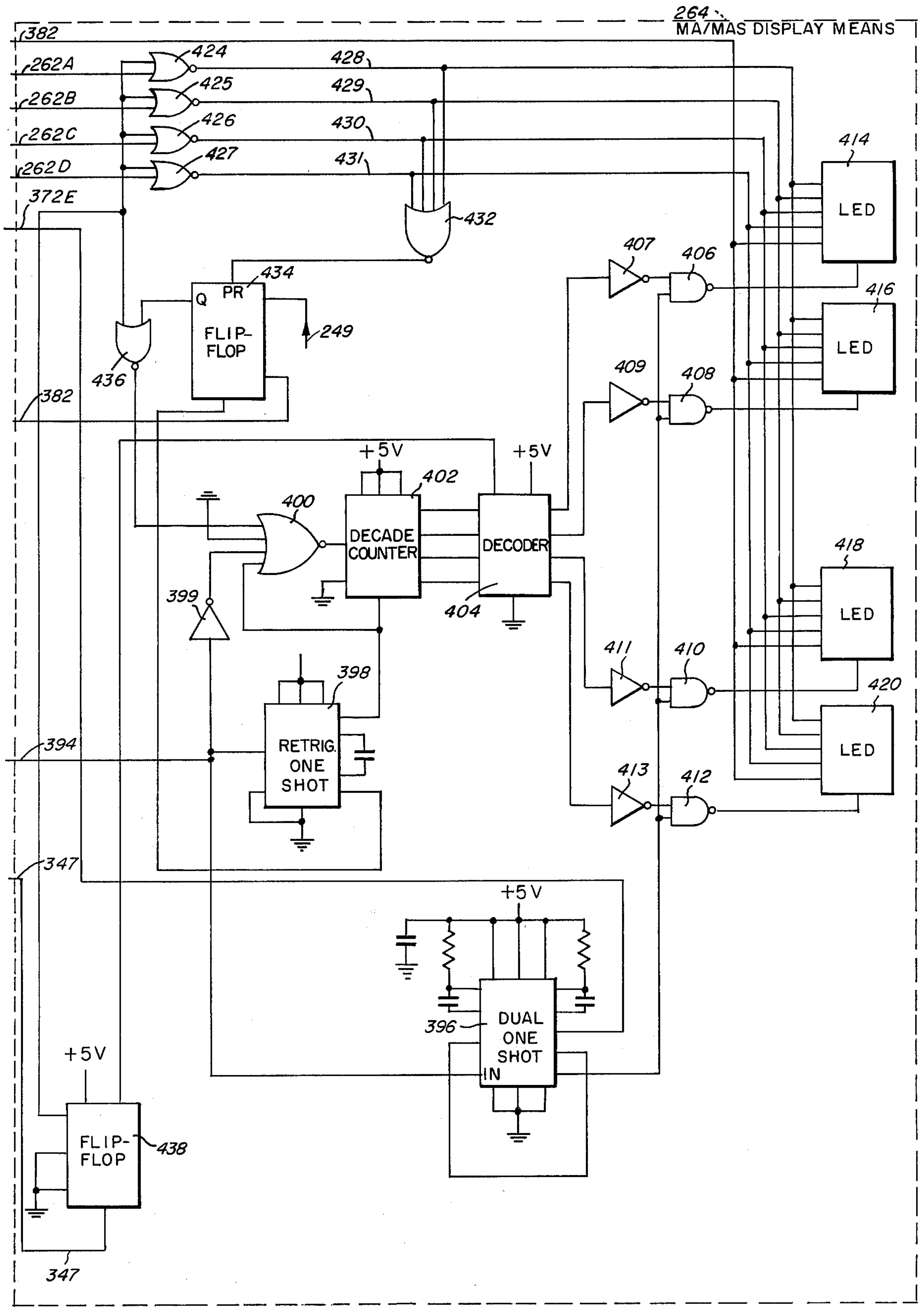
FIG. 9 is a schematic view of the display means shown in FIG. 1.

As shown in FIG. 9, the output conductors 262A–262D are connected to respective input terminals of Nor gates 424–427, respectively, which have respective output conductors 428–431 connected to input terminals of light emitting diodes 414, 416, 418, and 420. Also, the decimal point signal on output conductor 382 is connected to respective input terminals of the light emitting diodes 414, 416, 418, and 420. The train of pulses derived from scanning lines $D_1$–$D_8$ are applied through the output conductor 394 to respective input terminals of a dual one-shot multivibrator 396 and a retriggerable one-shot multivibrator 398, and are applied through an inverter 399 to a respective input terminal of Nor gate 400. Accordingly, the dual one-shot multivibrator 396 produces a corresponding train of latching pulses which are applied to connected input terminals of Nand gates 406, 408, 410, and 412, respectively, each of which has an output terminal connected to a respective one of the light-emitting diodes (LEDs) 414, 416, 418, and 420. The latching pulses serve to lock into the LEDs the digital signals received from conductors 428–431, respectively, and the decimal point signal applied through conductor 382.

The other input terminals of Nand gates 406, 408, 410, and 412 are connected through respective inverters 407, 409, 410, and 411 to respective output terminals of a decoder device 404, which receives a predetermined sequence of output selector signals from a decade counter 402. The train of pulses on conductor 394 enables the retriggerable one-shot multivibrator 398 to produce a sustained logic low output signal which is applied to a connected input terminal of the decade counter 402 and a connected input terminal of the Nor-gate 400. With the other input terminals at logic Lows, the train of pulses applied through the inverter 399 to the connected input terminal of Nor gate 400 is enabled, in effect, to pass through the Nor gate 240 and be counted by the counter 402. As a result, the decoder 404 is enabled to select the respective Nand gates 406, 408, 410, and 412 in the correct sequence for entering the four most significant digits and the decimal point into the proper LEDs 414, 416, 418, and 420. Thus, the measured MAS value with its associated decimal point properly inserted therein or the calculated MA value with its associated decimal point properly inserted therein, depending on the position of the MA/MAS switch 296, is produced in a four digit display.

Figure 10:
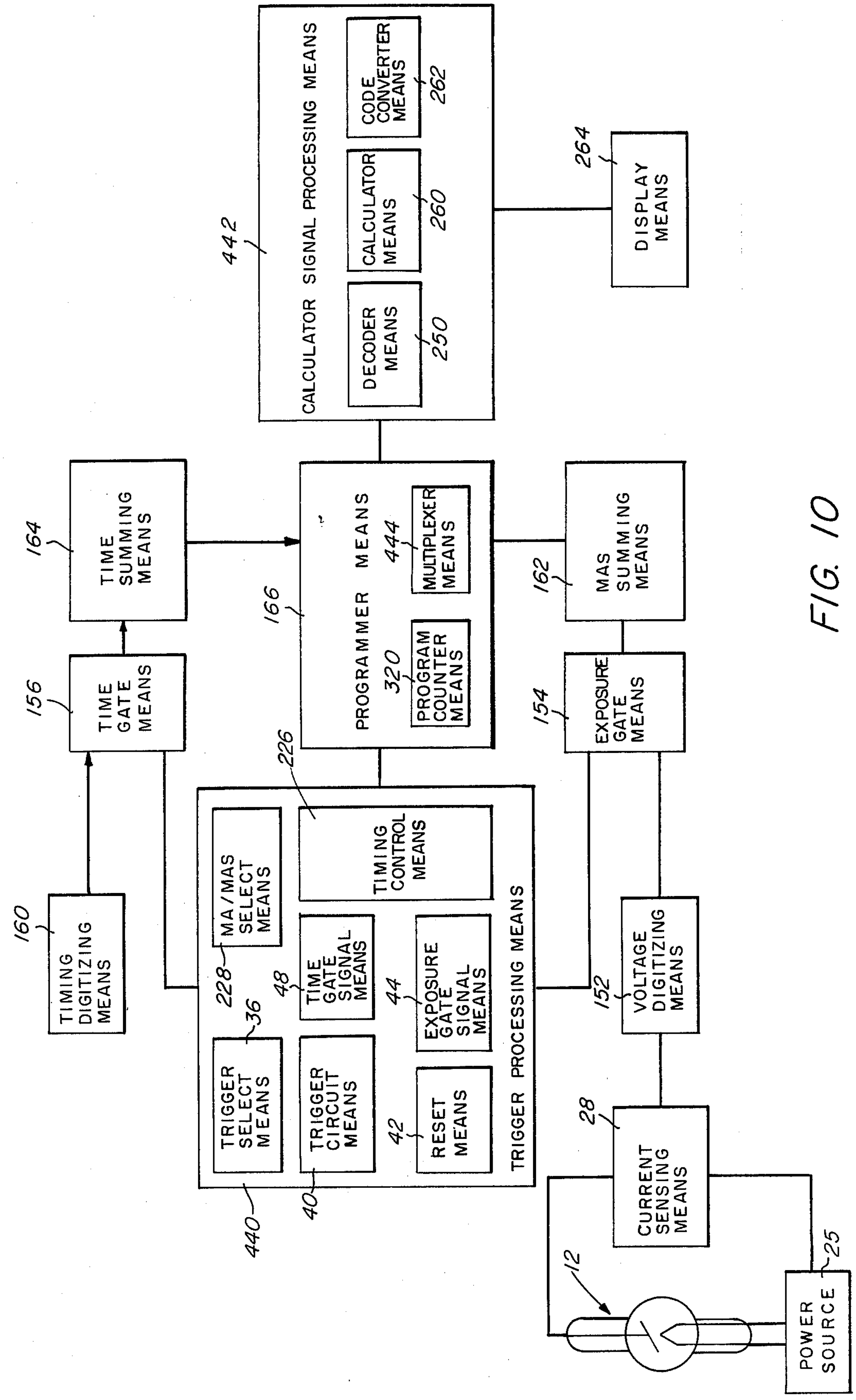
FIG. 10 is a block diagram view of more basic embodiment of the system shown in FIG. 1.

Thus, as shown in FIG. 10, the described system 10 basically comprises a current sensing means 28 connected into the anode circuit of an X-ray tube 12 for measuring the current and producing a corresponding analog voltage waveform signal. The analog voltage signal is digitized by a connection voltage digitizing means comprising the voltage-to-frequency converting means 152 which produces an output train of pulses having an instantaneous frequency proportional to the instantaneous amplitude of the analog voltage waveform signal. This frequency variable train of pulses is passed through an exposure gate means comprising And gate 154 when gated "on" at the commencement of an exposure interval by the exposure gate signal means 44. The exposure gate signal means 44 is included in a trigger signal processing means 440 which also includes the time gate signal means 48 for gating on the time gate means comprising And gate 156 for a time duration equivalent to the exposure interval. When gated on, the time gate means 156 permits a uniform train of pulses to pass through from a time digitizing means comprising timing means 160. The uniform train of pulses allowed through the time gating means are counted as equal increments of time by a time summing means comprising the time counter means 164 to obtain an integrated quantity substantially equal to the exposure time. The frequency variable train of pulses allowed through the exposure gate means during the exposure interval are counted by an MAS summing means 162 comprising MAS counter means 162 to obtain an integrated quantity equal to the milliampere-second MAS exposure quantity.

The integrated time and MAS quantities are entered into the programmer means 166 comprising the program counter 320 and a multiplexer means 444 comprising the multiplexers 322–326 for determining the sequence of operations performed on the MAS and time quantities to obtain MAS or MA values. This sequence is started and stopped by suitable signals from the timing control means 226 and the MA/MAS select means 228 which also constitute respective components of the trigger signal processing means 226. The sequence of digital and operational signals produced by the programmer means 166 is sent to a calculator signal processing means comprising the decoder means 250, the calculator means 260 and the code converter means 262 for performing the sequence of operations and producing output signals representative of the desired quantity. The output signals produced by the calculator signal processing means are sent to the display means 264 for producing a visible numerical value of the measured MAS quantity or the calculated MA quantity.

From the foregoing it will be apparent that all of the objectives of this invention have been achieved by the structures shown and described herein. It also will be apparent, however, that various changes may be made by those skilled in the art without departing from the spirit of the invention as expressed in the appended claims. It is to be understood, therefore, that all matter shown and described herein is to be interpreted as illustrative and not in a limiting sense.

What we claim is:

1. A system for testing an X-ray tube comprising:

anode current sensing means disposed for electrical connection to the anode of the tube for producing an analog voltage signal representative of anode current during an operational interval of the tube;

voltage to frequency converter means connected to the output of the anode current sensing means for producing a train of pulses having an instantaneous frequency proportional to the instantaneous amplitude of the analog voltage signal;

voltage pulse gating means connected to the output of the voltage to frequency converter means for permitting the passage of pulses in the train only during the operational interval;

trigger signal means connected to an input of the voltage gating means for rendering the gating means conductive at the commencement of the operational interval and including voltage gate signal means for producing a voltage gate signal during the entire operational interval and means for prolonging the voltage gate signal beyond the termination of the operational interval; and voltage pulse counting means connected to the output of the gating means for counting pulses passed through the gating means during the operational interval and obtaining a quantity equivalent to the product of the anode current and the length of time transpired during the operational interval.

2. A system as set forth in claim 1 wherein the trigger signal means includes reset means for automatically setting the voltage pulse counter means at zero prior to passage of the pulses through the gating means.

3. A system as set forth in claim 2 wherein the reset means includes means for sensing the commencement of the voltage gate signal.

4. A system for testing an X-ray tube comprising:

anode current sensing means disposed for electrical connection to the anode of the tube for producing an analog voltage signal representative of anode current during an operational interval of the tube;

voltage to frequency converter means connected to the output of the anode current sensing means for producing a train of pulses having an instantaneous frequency proportional to the instantaneous amplitude of the analog voltage signal, voltage pulse gating means connected to the output of the voltage to frequency converter means for permitting the passage of pulses in the train only during the operational interval;

time digitizing means for producing a uniform train of pulses, each being representative of substantially equal increments of time;

time pulse gating means connected to the output of the time digitizing means for permitting the passage of pulses in the train during a time interval equivalent to the operational interval;

trigger signal means connected to the voltage pulse gating means and to the time gating means for rendering the gating means conductive during the operational interval;

voltage pulse counting means connected to an output of the voltage pulse gating means for counting pulses passed through the voltage pulse gating means during the operational interval and obtaining a quantity corresponding to the product of the anode current and the time transpired during the operational interval;

time pulse counting means connected to an output of the time pulse gating means for counting the pulses passed through the time pulse gating means during the equivalent time interval and obtaining a quantity corresponding to the equivalent time interval; and circuit means for modifying the quantity corresponding to the product of the anode current and the time transpired during the operational interval with the quantity corresponding to the equivalent time interval and obtaining a resulting quantity corresponding to the average anode current during the operational interval.

5. A system as set forth in claim 4 wherein the trigger circuit means includes voltage gate signal means for producing a voltage gate signal during the entire operational interval, and time gate signal means for producing a time gate signal during the equivalent time interval.

6. A system as set forth in claim 5 wherein the trigger circuit means includes means for prolonging the voltage gate signal and the time gate signal beyond the termination of the operational interval.

7. A system as set forth in claim 6 wherein the trigger circuit means includes time compensating means for delaying the commencement of the time gate signal for an interval of time substantially equal to its prolongation beyond the termination of the operational interval.

8. A system as set forth in claim 5 wherein the trigger circuit means includes reset means for automatically setting the voltage pulse counting means and the time pulse counting means at respective zero positions prior to passage of the pulses through the counting means.

9. A system as set forth in claim 6 wherein the reset means includes means for sensing the commencement of the voltage gate pulse.

10. A system as set forth in claim 4 wherein the circuit means includes calculator signal processing means connected electrically to the outputs of the counting means for optionally performing mathematical operations on the quantity corresponding to the product of the anode current and the time transpired during the operational interval.

11. A system as set forth in claim 10 wherein the circuit means include programmer means connected electrically between the counting means and the calculator signal processing means for sequencing said mathematical operations.

12. A system as set forth in claim 11 wherein the trigger signal means includes timing control means connected to the programmer means and the calculating means for automatically starting and stopping the sequencing and mathematical operations at the occurrences of predetermined events.

13. A system as set forth in claim 11 wherein the circuit means includes display means connected electrically to the output of the calculating signal processing means for displaying values of signals received therefrom.

* * * * *

UNITED STATES PATENT OFFICE

CERTIFICATE OF CORRECTION

Patent No. 4,097,793 Dated June 27, 1978

Inventor(s) Jonathan S. Shapiro, Vincent Berluti, Jr., Anthony Pellegrino and Howard G. Wagner It is certified that error appears in the above-identified patent and that said Letters Patent are hereby corrected as shown below:

Column 6, line 53, change "Q" to --$\bar{Q}$--.

Column 8, line 4, after and change "Q" to --$\bar{Q}$--.

Column 10, line 23, change "In" to --in--.

Column 11, line 9, change "186" to --187--.

Column 13, line 59 change "206d" to --260d--.

Column 14, line 38, delete --Q--.

Column 14, line 39, after and change "Q" to --$\bar{Q}$--.

Column 14, line 67, change "Q" to --$\bar{Q}$--.

Column 16, line 36, change "Q" to --$\bar{Q}$--.

Column 16, line 58, change "325" to --326--.

Column 18, line 39, change "266" to --226--.

Column 19, line 19, change "276" to --286--.

Column 21, line 68, change "Q" to --$\bar{Q}$--.

Column 22, line 26, change "202" to --292--.

Column 22, line 38, change "Q" to --$\bar{Q}$--.

UNITED STATES PATENT OFFICE

CERTIFICATE OF CORRECTION

Patent No. 4,097,793 Dated June 27, 1978

Inventor(s) Jonathan S. Shapiro, Vincent Berluti, Jr., Anthony Pellegrino and Howard G. Wagner It is certified that error appears in the above-identified patent and that said Letters Patent are hereby corrected as shown below:

Column 22, line 54, change "Q" to --Q--.

Column 23, line 66, change "240" to --400--.

Signed and Sealed this

*Fifth* Day of *June 1979*

[SEAL]

*Attest:*

RUTH C. MASON
*Attesting Officer*

DONALD W. BANNER
*Commissioner of Patents and Trademarks*